(12) United States Patent
Sugito et al.

(10) Patent No.: US 7,017,657 B2
(45) Date of Patent: Mar. 28, 2006

(54) COOLING DEVICE BOILING AND CONDENSING REFRIGERANT

(75) Inventors: Hajime Sugito, Nagoya (JP); Hiroshi Tanaka, Toyoake (JP)

(73) Assignee: DENSO Corporation, Kariya (JP)

( * ) Notice: Subject to any disclaimer, the term of this patent is extended or adjusted under 35 U.S.C. 154(b) by 208 days.

(21) Appl. No.: 10/800,097

(22) Filed: Mar. 12, 2004

(65) Prior Publication Data

US 2004/0173342 A1   Sep. 9, 2004

Related U.S. Application Data

(62) Division of application No. 10/136,086, filed on May 1, 2002, now abandoned.

(30) Foreign Application Priority Data

| May 11, 2001 | (JP) | ............................. 2001-141014 |
| Jul. 27, 2001 | (JP) | ............................. 2001-227260 |
| Apr. 15, 2002 | (JP) | ............................. 2002-112563 |

(51) Int. Cl.
*F28D 15/00* (2006.01)
*F28D 9/02* (2006.01)
*H05K 7/20* (2006.01)

(52) U.S. Cl. ............................. 165/104.21; 165/104.33; 165/173; 165/175; 361/687; 361/690; 361/700; 257/714; 257/715

(58) Field of Classification Search ........... 165/104.21, 165/104.33, 173, 175; 361/687, 690, 700; 257/714, 715
See application file for complete search history.

(56) References Cited

U.S. PATENT DOCUMENTS

| 3,372,738 | A | * | 3/1968 | Jan et al. ........................ 165/47 |
| 4,333,520 | A | * | 6/1982 | Yanadori et al. ............... 165/59 |
| 4,350,838 | A | * | 9/1982 | Harrold ...................... 174/15.1 |
| 4,873,798 | A | | 10/1989 | Sato |
| 5,242,016 | A | | 9/1993 | Voss et al. ................... 165/174 |
| 5,396,947 | A | * | 3/1995 | Itoh ........................ 165/104.14 |
| 5,647,430 | A | * | 7/1997 | Tajima ................... 165/104.33 |
| 5,713,413 | A | * | 2/1998 | Osakabe et al. ........ 165/104.33 |
| 5,865,244 | A | | 2/1999 | Moser ......................... 165/173 |

(Continued)

FOREIGN PATENT DOCUMENTS

JP        57-204156        12/1982

*Primary Examiner*—Henry Bennett
*Assistant Examiner*—Nihir Patel
(74) *Attorney, Agent, or Firm*—Harness, Dickey & Pierce, PLC

(57) ABSTRACT

A cooling device boiling and condensing refrigerant includes a refrigerant container, a header tank, and tubes between the refrigerant container and the header tank. In the cooling device, each of the refrigerant container and the header tank has a stack structure constructed by stacking plural plates. Each plate is a press member formed by punching a metal plate using a press die. Accordingly, each capacity of the refrigerant container and the header tank can be readily changed in accordance with a thermal load, and the plates having the same shape can be used in common for both the refrigerant container and the header tank.

22 Claims, 20 Drawing Sheets

U.S. PATENT DOCUMENTS

| | | | |
|---|---|---|---|
| 5,998,863 A * | 12/1999 | Kobayashi et al. | 257/715 |
| 6,005,772 A * | 12/1999 | Terao et al. | 361/699 |
| 6,073,683 A * | 6/2000 | Osakabe et al. | 165/104.33 |
| 6,119,767 A * | 9/2000 | Kadota et al. | 165/104.33 |
| 6,341,646 B1 * | 1/2002 | Tanaka et al. | 165/104.33 |
| 6,357,517 B1 * | 3/2002 | Osakabe et al. | 165/104.33 |
| 6,360,814 B1 * | 3/2002 | Tanaka et al. | 165/104.33 |
| 6,382,308 B1 * | 5/2002 | Okamoto | 165/104.21 |
| 6,588,498 B1 * | 7/2003 | Reyzin et al. | 165/104.33 |
| 6,714,413 B1 * | 3/2004 | Ghosh et al. | 361/700 |
| 6,742,575 B1 * | 6/2004 | Suzuki | 165/104.21 |
| 6,863,119 B1 * | 3/2005 | Sugito et al. | 165/104.33 |

* cited by examiner

COOLING AIR

COOLING AIR

COOLING DEVICE BOILING AND CONDENSING REFRIGERANT

CROSS-REFERENCE TO RELATED APPLICATION

This application is a divisional of U.S. patent application No. 10/136,086 filed on May 1, 2002 abandoned. This application is related to and claims priority from Japanese Patent Applications No. 2001-141014 filed on May 11, 2001, No. 2001-227260 filed on Jul. 27, 2001 and No. 2002-112563 filed on Apr. 15, 2002, the contents of which are hereby incorporated by reference.

BACKGROUND OF THE INVENTION

1. Field of the Invention

The present invention relates to a cooling device for cooling a heat-generating member by movement of latent heat based on boiling and condensation of refrigerant.

2. Description of Related Art

As shown in FIG. 39, in a conventional cooling device 100 constructed by a refrigerant container 110 and a heat radiation core 120, a heat-generating member 130 is attached to a heat reception plate of the refrigerant container 110. The heat radiation core 120 is constructed by a pair of header tanks 121, plural tubes (heat radiation tubes) 122 and heat radiation fins 123. The header tanks 121 are attached to a heat radiation plate 111 of the refrigerant container 110 to be substantially perpendicular to the heat radiation plate 111. Each of the tubes 122 is disposed between the header tanks 121 to communicate with the header tanks 121. Refrigerant stored in the refrigerant container 110 is boiled and evaporated by receiving heat from the heat-generating member 130, and the evaporated refrigerant (gas refrigerant) flows into the tubes 122 from the refrigerant container 110 through the header tanks 121. The gas refrigerant radiates heat to outside air and is condensed to be liquid refrigerant while flowing through the tubes 122, and the condensed refrigerant (liquid refrigerant) is returned into the refrigerant container 110. Thus, the heat-generating member 130 is cooled.

In the cooling device 100, when the tube 122 is inserted deeply into the header tank 121, an opening of the tube 122 may be closed by an inner surface of the header tank 121. When the thickness of the header tank 121 is set larger in order to prevent the opening of the tube 122 from being closed, the capacity of the tubes 122 is reduced, and heat radiation performance of the heat radiation core 120 is also reduced, thereby reducing cooling performance of the cooling device 100. In addition, when the cooling device 100 is used in a bottom posture where the heat-generating member 130 is positioned under the refrigerant container 110, refrigerant circulation fails and heat radiation performance is reduced.

SUMMARY OF THE INVENTION

In view of the foregoing problems, it is an object of the present invention to provide a cooling device which improves a refrigerant circulation by reducing interference between gas refrigerant and liquid refrigerant in tubes, so that cooling performance is improved.

It is an another object of the present invention to provide a cooling device where cooling performance can be improved while a thickness of a header tank is reduced.

It is a further another object of the present invention to provide a cooling device where a capacity of a header tank can be readily changed and production cost can be reduced, while the cooling capacity can be improved.

According to the present invention, in a cooling device for cooling a heat-generating member by boiling and condensing refrigerant, refrigerant is boiled by receiving heat from a heat-generating member attached to a refrigerant container, and flows into a header tank through plural tubes to radiate heat to outside in a heat radiation core. In the cooling device, the refrigerant container is constructed by stacking a plurality of plates to define a space where refrigerant is stored, and the header tank is also constructed by stacking a plurality of plates. Therefore, the plates having the same shape can be used in common for both the refrigerant container and the header tank, and the cooling device can be manufactured in low cost. In addition, in the cooling device, the capacity of the header tank or the refrigerant container can be readily changed in accordance with a thermal load in the heat-generating member, only by increasing or decreasing the number of the plates. Accordingly, cooling performance in the cooling device can be improved while being manufactured in low cost.

Preferably, the plurality of tubes includes first tubes through which refrigerant flows from the refrigerant container to the header tank and second tubes through which refrigerant flows from the header tank to the refrigerant container. Further, a first barrier portion, for restricting refrigerant from flowing into the second tube, is provided in the refrigerant container, and a second barrier portion, for restricting refrigerant from flowing into the first tube, is provided in the header tank. Accordingly, gas refrigerant, boiled by receiving heat from the heat-generating member in the refrigerant container flows into the first tubes, and liquid refrigerant in the header tank can be returned into the refrigerant container through the second tubes. Therefore, it can restrict an interference between the gas refrigerant from the refrigerant container to the header tank, and the liquid refrigerant from the header tank to the refrigerant container, thereby improving refrigerant circulation and cooling performance.

Alternatively, in the cooling device, the plurality of tubes includes first tubes each having an insertion length inserted into the header tank, and second tubes each having an insertion length inserted into the header tank, smaller than that of each first tube. Each first tube protrudes from an inner surface of the header tank inside the header tank by a predetermined length. Accordingly, an amount of liquid refrigerant introduced into the first tubes from the header tank is reduced. On the contrary, an amount of liquid refrigerant introduced into the second tubes from the header tank is increased. As a result, the amount of gas refrigerant flowing into the first tubes from the refrigerant container is increased, thereby improving the refrigerant circulation.

Preferably, the header tank includes a first plate defining a plurality of first holes into which the tubes are inserted, and a second plate on which the first plate is stacked. The second plate defines a plurality of second holes each having an open area smaller than an open area of each first hole, and the tube is inserted into the first hole to contact the second plate around the second hole to communicate with the second hole. Accordingly, each tube can be readily positioned at a predetermined position in a stack direction of the plates without using an additional part such as spacers. Therefore, it can prevent an opening portion in each tube from contacting an inner surface of the header tank, while the thickness of the header tank can be reduced.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiments of the present invention will be described hereinafter with reference to the accompanying drawings.

Figure 1:
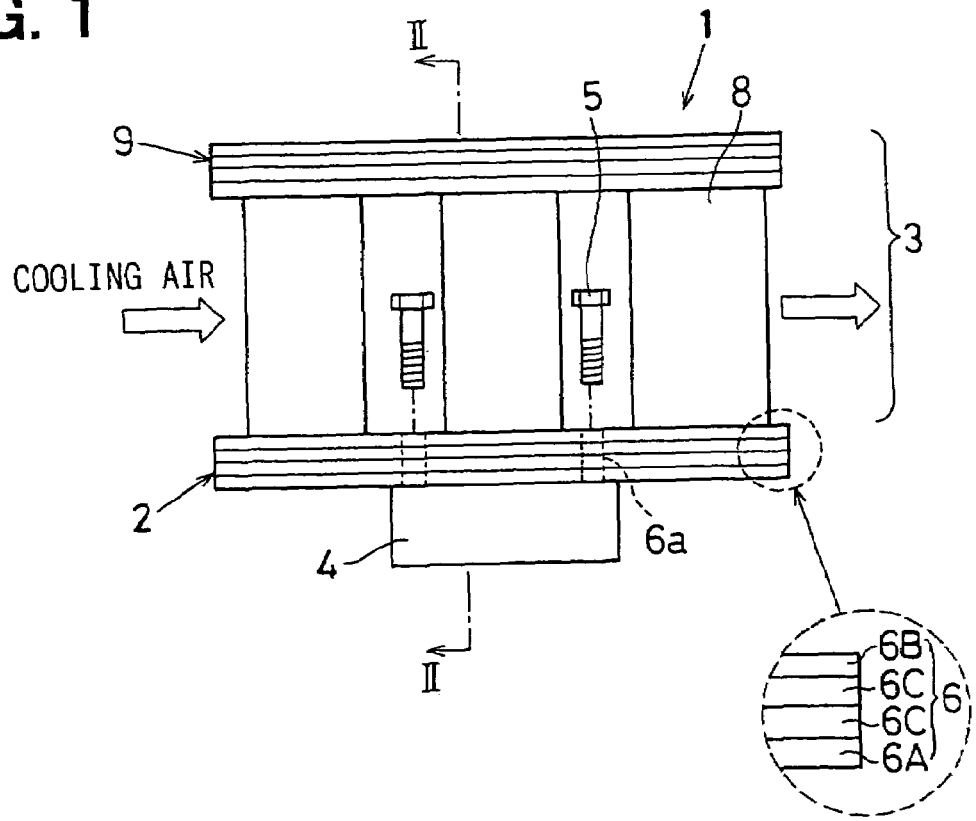
FIG. 1 is a schematic side view showing a cooling device according to a first embodiment of the present invention.

A first embodiment of the present invention will be now described with reference to FIGS. 1–4. As shown in FIG. 1, a cooling device 1 according to the first embodiment is constructed by a refrigerant container 2 and a heat radiation core 3. In the cooling device 1, a heat-generating member 4 is fixed to a bottom surface of the refrigerant container 2 substantially at a center by using screws 5. For example, the heat-generating member 4 is a computer chip mounted on a printed circuit board. Further, the refrigerant container 2 has a stack structure constructed by stacking plural plates 6, for example, four plates 6.

Figure 2:
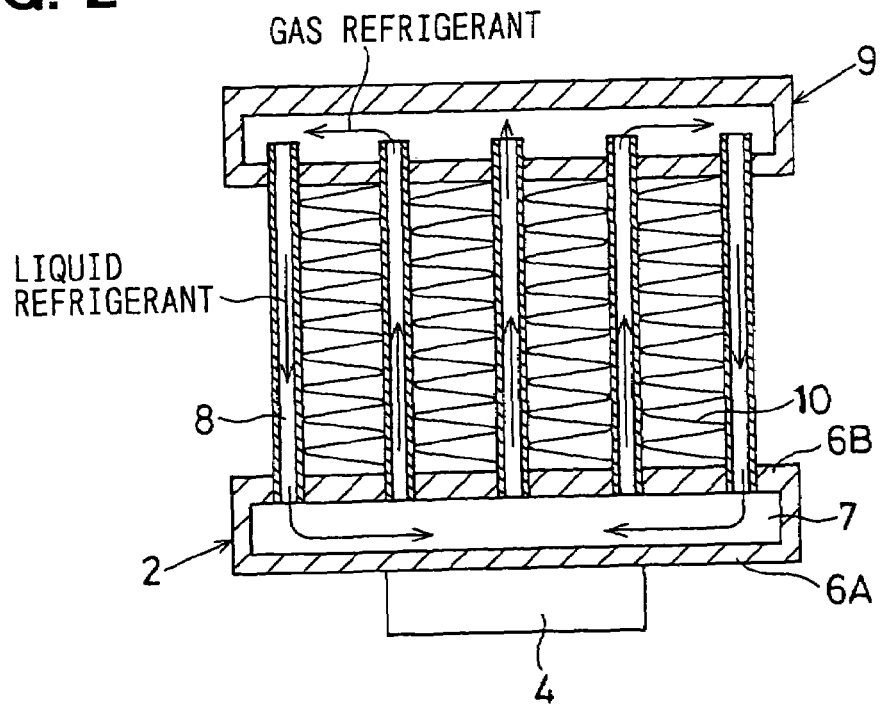
FIG. 2 is a schematic sectional view showing the cooling device taken along line II—II in FIG. 1.

FIG. 2 is a cross-sectional view taken along line II—II in FIG. 1. The refrigerant container 2 defines a refrigerant chamber 7 therein as shown in FIG. 2, and a predetermined amount of refrigerant is stored in the refrigerant chamber 7. In FIGS. 3A–3D, each plate 6 (6A, 6B, 6C, 6D) is a press member formed by punching a metal plate such as an aluminum plate or a stainless steel plate using a press die. Further, the metal plate may be a brazing sheet where a brazing material layer is beforehand provided on a surface of a metal sheet. Specifically, the plates 6 include a heat reception plate 6A, a heat radiation plate 6B and two (three or more) intermediate plates 6C. The heat reception plate 6A and the heat radiation plate 6B are disposed at both outside of the refrigerant container 2, and the intermediate plates 6C are sandwiched between the outside plates 6A, 6B.

Figure 3A:
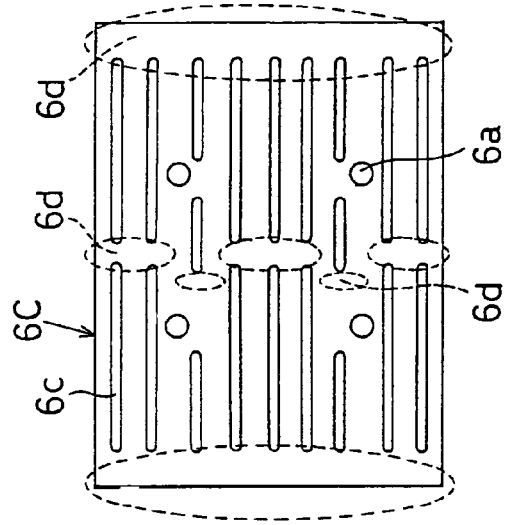
FIG. 3A is a plan view showing a heat radiation plate constructing a refrigerant container of the cooling device.
Figure 3B:
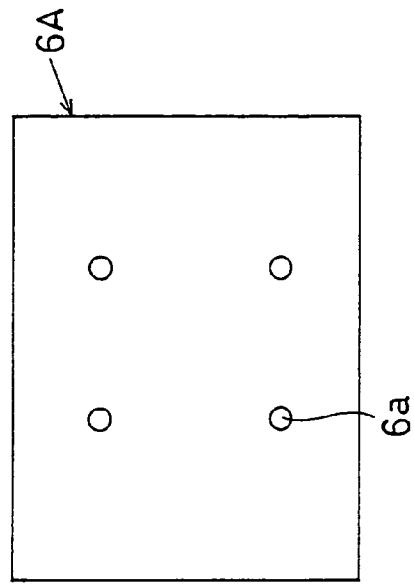
FIG. 3B is a plan view showing an intermediate plate constructing the refrigerant container.
Figure 3C:
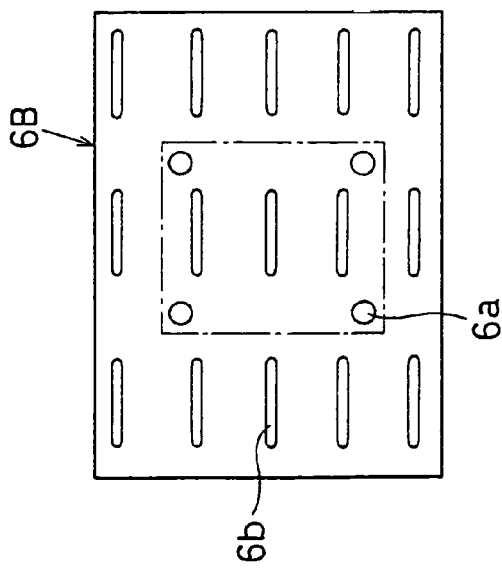
FIG. 3C is a plan view showing an intermediate plate constructing the refrigerant container.
Figure 3D:
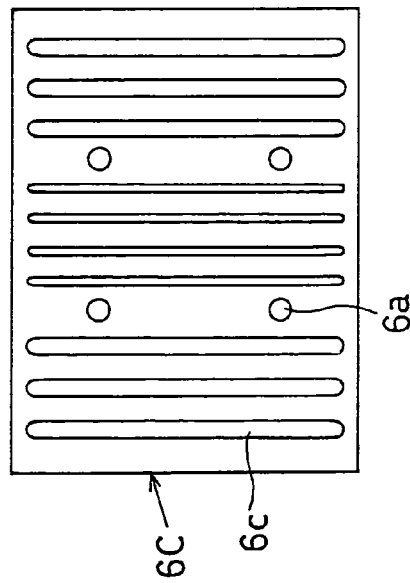
FIG. 3D is a plan view showing a heat reception plate constructing the refrigerant container, according to the first embodiment.

As shown in FIGS. 3A–3D, four attachment holes 6a, into which the screws are screwed for fixing the heat-generating member 4 to the heat reception plate 6A, are provided in each of the plates 6 as through holes in a stack direction of the plates 6. Plural openings 6b, into which tubes 8 of the heat radiation core 3 are inserted, are provided in the heat radiation plate 6B, as shown in FIG. 3A. As shown in FIGS. 3B, 3C, plural slits 6c are provided in two patterns A, B in the intermediate plates 6C substantially over all the surface, respectively. In the pattern A shown in FIG. 3B, the slits 6c are provided to extend in a longitudinal direction of the intermediate plate 6C. In the pattern B shown in FIG. 3C, the slits 6c are provided to extend in a direction perpendicular to the longitudinal direction of the intermediate plate 6C. The slits 6c of the pattern A and the slits 6c of the pattern B are provided to communicate with each other, and to define the refrigerant chamber 7. Further, metal portions are provided between the slits 6c, to form a thermal conductor in the stack direction of the intermediate plates 6C when the intermediate plates 6C are stacked. The heat reception plate 6A and the heat radiation plate 6B are thermally connected to each other by the thermal conductor of the intermediate plates 6C.

Figure 4:
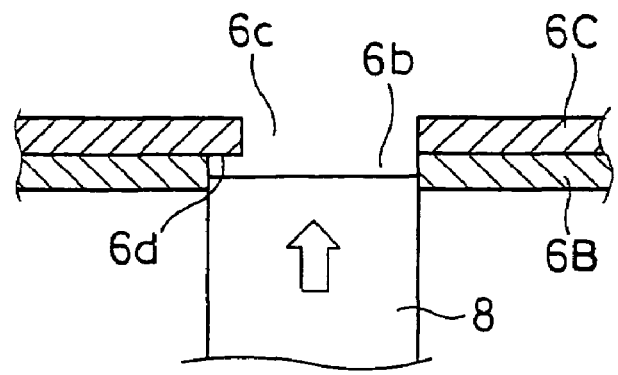
FIG. 4 is a sectional view showing a stopper structure of the refrigerant container according to the first embodiment.

The intermediate plate 6C with the pattern A shown in FIG. 3B, stacked with the heat radiation plate 6B, includes tube stoppers 6d (metal portions) each for stopping a further insertion of the tube 8 inserted into the opening 6b of the heat radiation plate 6B. Specifically, as shown in FIG. 4, when the intermediate plate 6C is stacked with the heat radiation plate 6B, a part of the metal portion (where the slit 6c is not provided) of the intermediate plate 6C covering the opening 6b is used as the stopper 6d, in the opening 6b of the heat radiation plate 6B. Thus, the tube 8, inserted into the opening 6b of the heat radiation plate 6B, contacts the stopper 6d and is positioned at a predetermined position in the stack direction of the plates 6.

For example, the heat radiation core 3 is constructed by plural tubes (e.g., 15 tubes) 8, a header tank 9 and heat radiation fins 10. One end of each tube 8 in a tube longitudinal direction is attached to the heat radiation plate 6B of the refrigerant container 2, and the other end of each tube 8 is attached to the header tank 9, so that the plural tubes 8 communicate with each other through the header tank 9. The radiation fins 10 such as corrugated fins are disposed between the adjacent tubes 8. The header tank 9 is also a stack structure constructed by stacking plural plates (e.g., four plates) 6 as in the refrigerant container 2. In the header tank 9, the attachment holes 6a are not provided in the plural plates 6, or are closed. One side ends of the tubes 8 are inserted into the openings 6b of the heat radiation plate 6B of the refrigerant container 2 to communicate the refrigerant chamber 7, and the other side ends of the tubes 8 are inserted into the header tank 9 to communicate with the header tank 9. After the cooling device 1 is temporarily assembled to an assemble body, the assemble body is integrally brazed in a vacuum, for example.

Next, the cooling device 1 according to the first embodiment will be now described. As shown in FIGS. 1 and 2, the cooling device 1 according to the first embodiment is used in a bottom posture where the heat-generating member 4 is located at a lower side of the refrigerant container 2 and the heat radiation core 3 is located at an upper side of the refrigerant container 2.

Refrigerant stored in the refrigerant container 2 (refrigerant chamber 7) is boiled and evaporated by receiving heat from the heat-generating member 4, and flows from the refrigerant chamber 7 into the header tank 9 mainly through the tubes 8 positioned in an attachment area of the heat-generating member 4 (i.e., area indicated by one-dot chain lines in FIG. 3A). The gas refrigerant flowing toward the header tank 9 through the tubes 8 is cooled and condensed while being distributed in the header tank 9. The condensed refrigerant (liquid refrigerant) is returned to the refrigerant chamber 7 through the tubes 8 disposed outside the attachment area of the heat-generating member 4. Thus, heat is transmitted from the heat-generating member 4 to refrigerant, and is further transferred to the heat radiation core 3 through the refrigerant. Thereafter, the heat is radiated as condensation latent heat while gas refrigerant is condensed in the heat radiation core 3, and is discharged to atmospheric air through the heat radiation fins 10.

Next, operational effects of the first embodiment will be described. In the cooling device 1 according to the first embodiment, each of the refrigerant container 2 and the header tank 9 is constructed by stacking the plural plates (press material) 6, and the plural plates 6 can be used in common for both the refrigerant container 2 and the header tank 9. Therefore, each plate 6 used for the refrigerant container 2 and the corresponding plate 6 used for the header tank 9 can be formed by a common press die. Accordingly, the number of expensive press dies can be reduced, and production cost of the cooling device 1 can be largely reduced. Further, the kinds of the plates 6 can be reduced by the plural plates 6 used in common for both the refrigerant container 2 and the header tank 9, thereby simplifying management of compartments of the cooling device.

In addition, the capacity of the refrigerant container 2 and the capacity of the header tank 9 can be readily changed only by increasing and reducing the number of the plates 6. Accordingly, the capacity of the refrigerant container 2 and the capacity of the header tank 9 can be readily changed in accordance with increase and decrease of thermal loads. In this case, since a new press die is not required even when the number of the plates 6 is increased, specifications for the cooling device can be readily changed in low cost, in the first embodiment.

Further, a surface area of the thermal conductor, formed by the metal portions of the intermediate plates 6C, can be changed only by changing shapes of the slits 6c thereof. Therefore, the heat radiation performance of the cooling device 1 can be increased without inner fins provided in the refrigerant chamber 7 of the refrigerant container 2. Further, as shown in FIG. 4, each of the refrigerant container 2 and the header tank 9 has the stack structure, and the stoppers 6d are provided in the intermediate plate 6C. Therefore, the tubes 8 can be readily inserted at a predetermined position in the stack direction without using an additional member such as spacers. Accordingly, an insertion length of the tubes 8 inserted into the refrigerant container 2 and the header tank 9 can be readily regulated.

Figure 5:
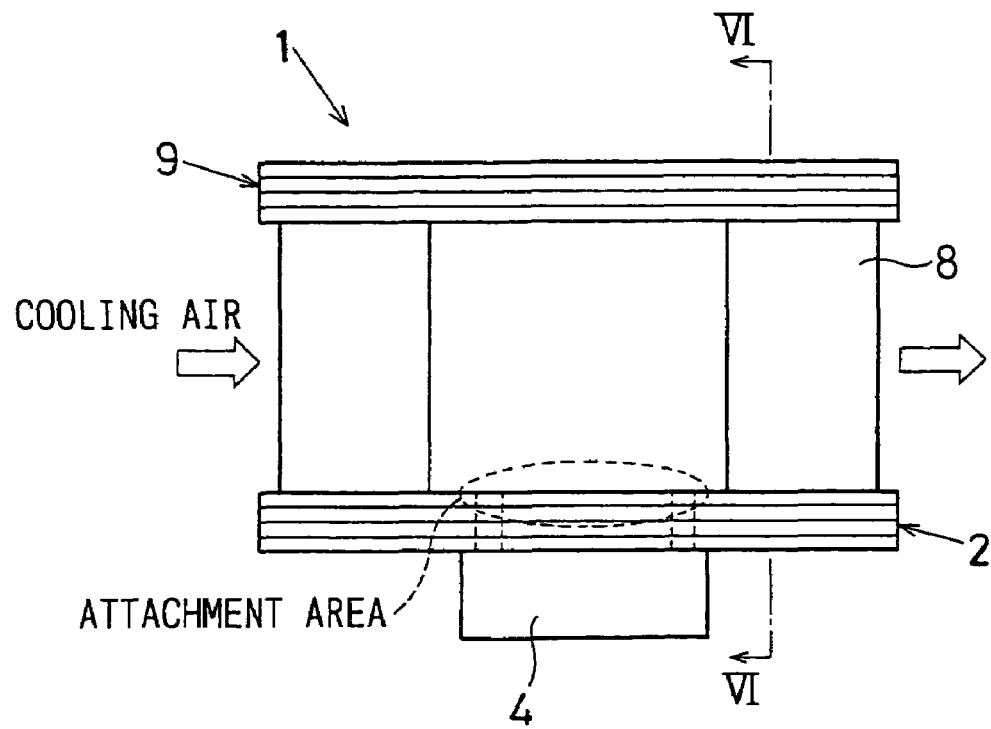
FIG. 5 is a schematic side view showing a cooling device according to a second embodiment of the present invention.

A second embodiment of the present invention will be described with reference to FIGS. 5, 6 and 7A–7D. In the second embodiment, the present invention is used for a cooling device 1 where the tubes 8 cannot be disposed in the attachment area of the-heat-generating member 4, as shown in FIG. 5. As shown in FIG. 7B, the openings 6b are provided in the heat radiation plate 6B at both sides outside the attachment area of the heat-generating member 4 (area indicated by one-dot chain lines). That is, no opening 6b is provided in the attachment area of the heat-generating member 4. Further, barrier portions 11, for restricting a flow of the condensed refrigerant (liquid refrigerant) returned from the header tank 9 to the refrigerant container 2, are provided in the intermediate plates 6C of the refrigerant container 2. Specifically, an intermediate plate 6C having slits 6c of the pattern A shown in FIG. 7B is stacked onto an intermediate plate 6C having slits 6c of the pattern B shown in FIG. 7C. The barrier portions 11 are formed by stacking metal portions of the intermediate plates 6C.

Figure 6:
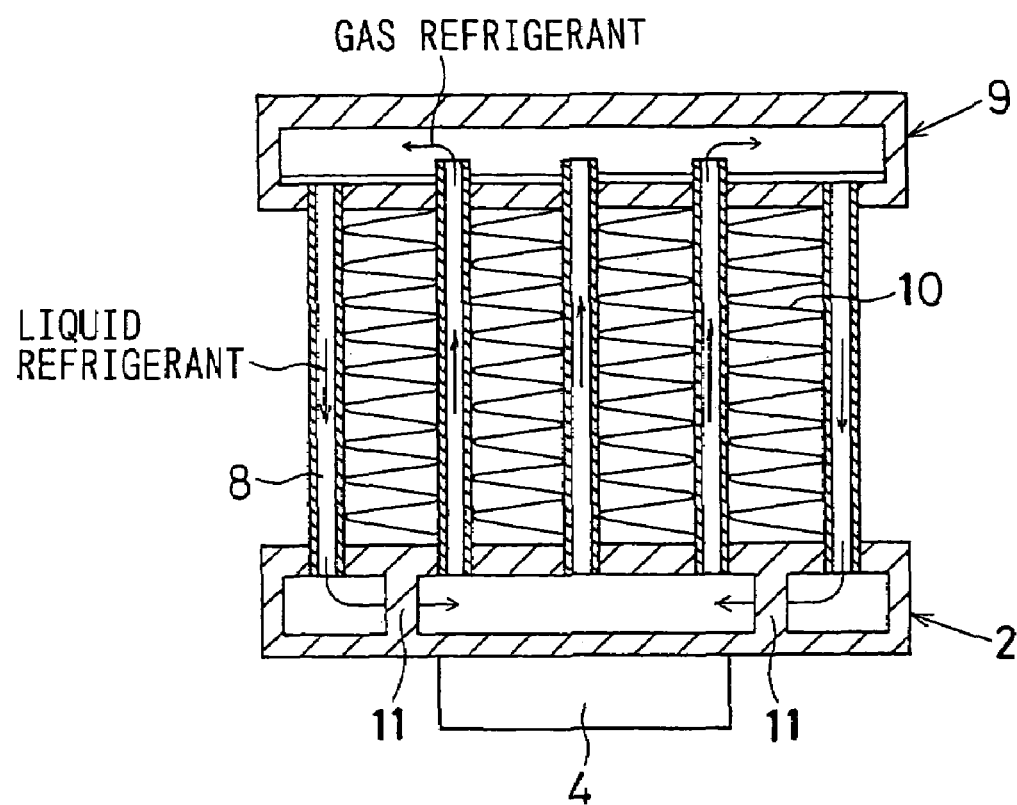
FIG. 6 is a schematic sectional view of the cooling device taken along line VI—VI in FIG. 5.
Figure 7B:
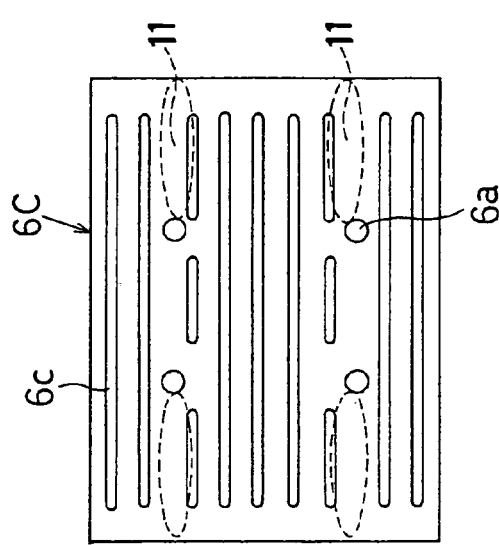
FIG. 7B is a plan view showing an intermediate plate constructing the refrigerant container.
Figure 7D:
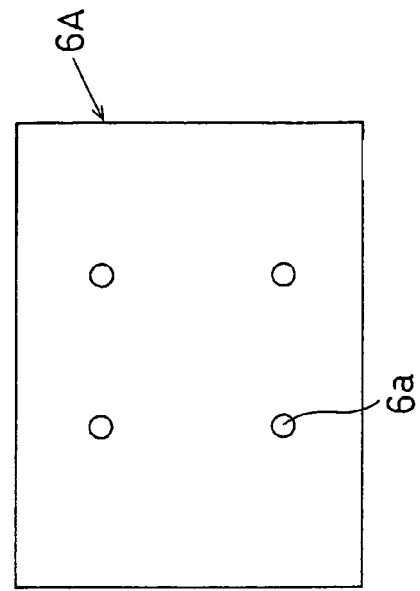
FIG. 7D is a plan view showing a heat reception plate constructing the refrigerant container.
Figure 7A:
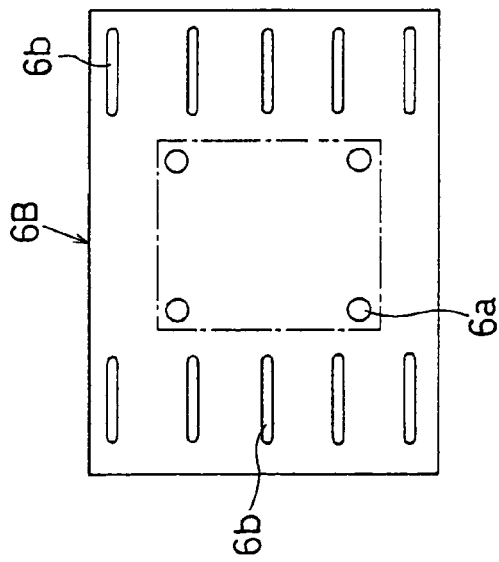
FIG. 7A is a plan view showing a heat radiation plate constructing a refrigerant container of the cooling device according to the second embodiment.
Figure 7C:
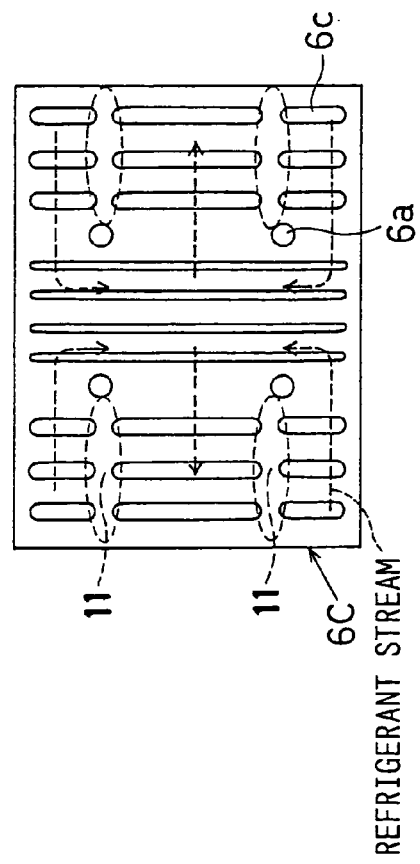
FIG. 7C is a plan view showing an intermediate plate constructing the refrigerant container.

Accordingly, as shown in FIG. 6, the refrigerant, boiled by receiving the heat from the heat-generating member 4, flows into the header tank 9 through the tubes 8 (first tube) around the attachment area of the heat-generating member 4. The boiled refrigerant (gas refrigerant) is cooled and condensed while being distributed into the header tank 9, and the condensed refrigerant (liquid refrigerant) is returned to the refrigerant container 2 through the tubes 8 (second tubes) away from the attachment area. As indicated by broken-line arrows in FIG. 7C, circulation roots of refrigerant are formed in the refrigerant container 2 by restricting the refrigerant flow using the barrier portions 11. Thus, refrigerant circulation is facilitated, and heat radiation performance can be improved.

Figure 8:
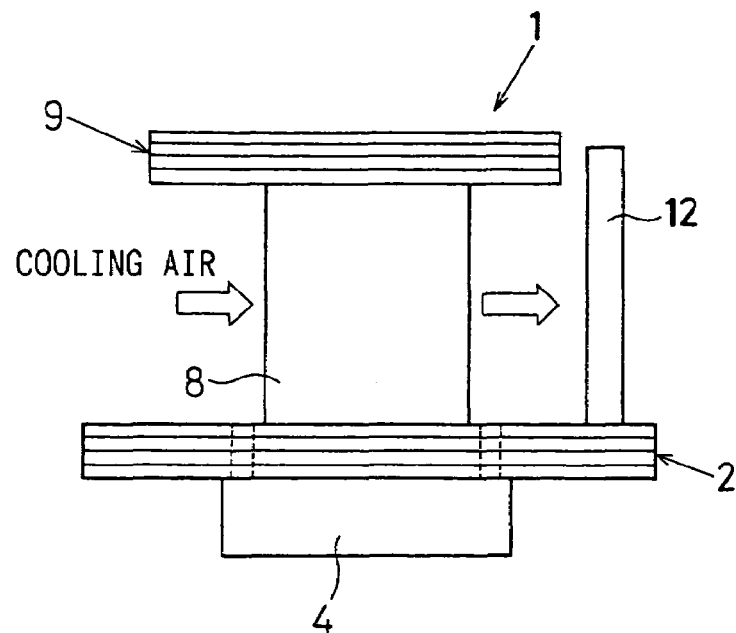
FIG. 8 is a schematic side view showing a cooling device according to a third embodiment of the present invention.

A third embodiment of the present invention will be now described with reference to FIG. 8, In a cooling device 1 of the third embodiment, a size of the refrigerant container 2 is different from a size of the header tank 9. Specifically, as shown in FIG. 8, the size of the header tank 9 is made smaller than the size of the refrigerant container 2, and a refrigerant inlet pipe 12, from which refrigerant is filled in the refrigerant container 2 (refrigerant chamber 7), is set in the refrigerant container 2 so as not to interfere with the header tank 9. Accordingly, the refrigerant inlet pipe 12 can be readily provided in the refrigerant container 2, while the tube insertion position can be accurately set.

Figure 9:
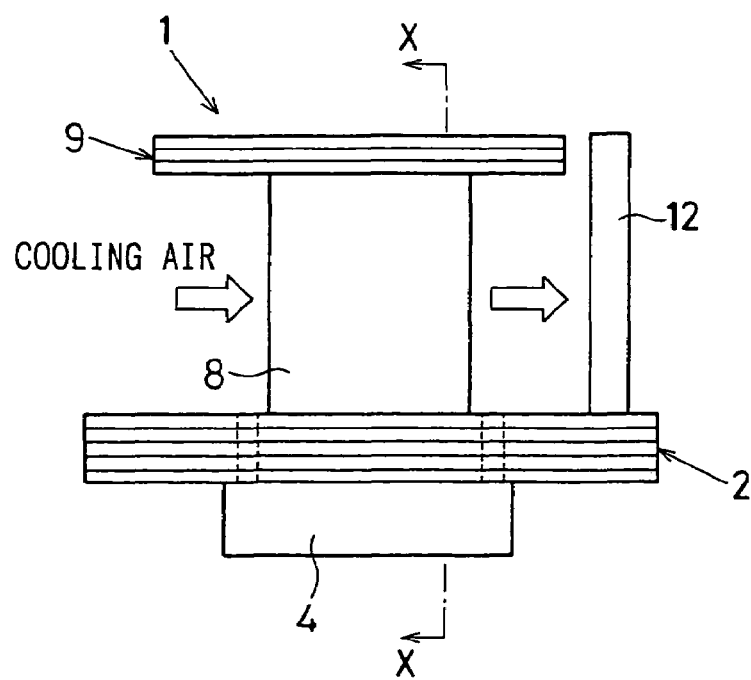
FIG. 9 is a schematic side view showing a cooling device according to a fourth embodiment of the present invention.
Figure 10:
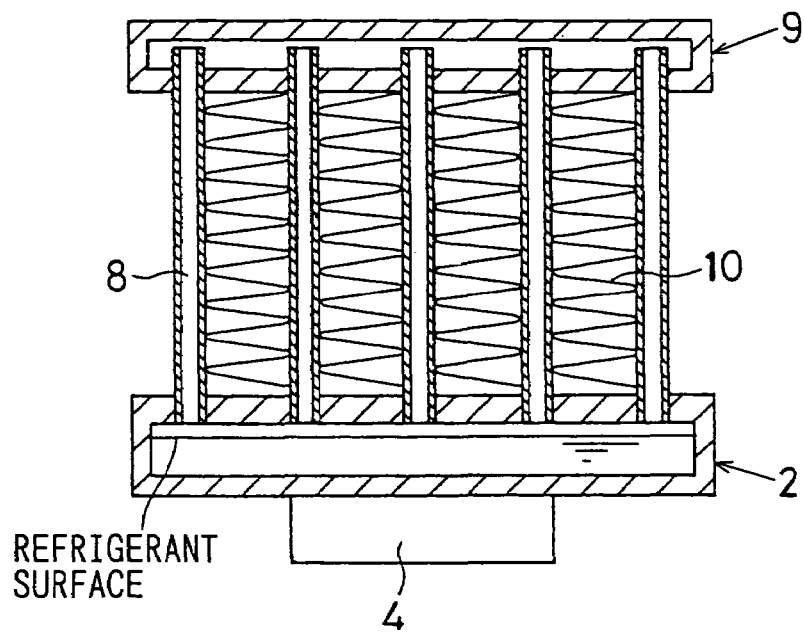
FIG. 10 is a schematic sectional view showing the cooling device, used in a bottom posture, taken along line X—X in FIG. 9.
Figure 11:
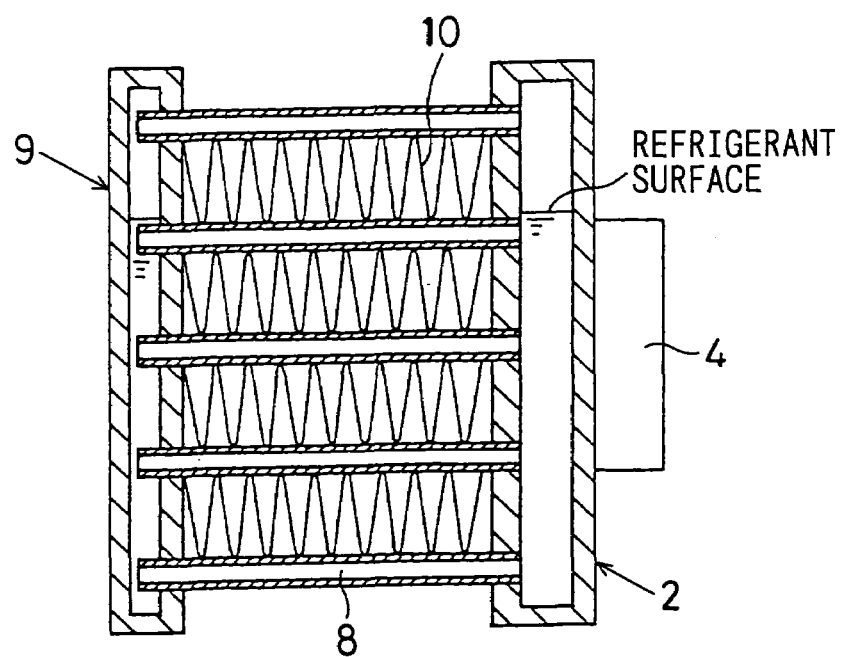
FIG. 11 is a schematic sectional view showing the cooling device, used in a side posture, in FIG. 9.

A fourth embodiment of the present invention will be now described with reference to FIGS. 9–11. In the fourth embodiment, the present invention is used for a cooling device 1 where the capacity of the header tank 9 is made smaller than the capacity of the refrigerant container 2 as shown in FIG. 9. Further, as shown in FIG. 10, the cooling device 1 may be used in a bottom posture where the refrigerant container 2 is disposed horizontally and the heat-generating member 4 is attached onto the bottom surface of the refrigerant container 2. Alternatively, as shown in FIG. 11, the cooling device 1 may be used in a side posture where the refrigerant container 2 is disposed vertically and the heat-generating member 4 is attached to the refrigerant container 2 on its side surface. When the cooling device 1 is used in the bottom posture, the cooling performance of the cooling device 1 is reduced when liquid refrigerant flows into the tubes 8 from the refrigerant container 2. Therefore, the liquid refrigerant surface is need to be made lower as well as possible. On the other hand, when the cooling device 1 is used in the side posture, refrigerant dries excessively around the heat-generating member 4 when the liquid refrigerant surface is made excessively lower. Therefore, liquid refrigerant surface is need to be set higher in accordance with an attachment position of the heat-generating member 4. In view of the above-described problem, the capacity of the header tank 9 is need to be set smaller than the capacity of the refrigerant container 2.

Specifically, when the cooling device 1 is used in the side posture shown in FIG. 11, liquid refrigerant enters into the header tank 9 and the refrigerant container 2. Therefore, as the capacity of the header tank 9 increases, the liquid refrigerant surface in the refrigerant container 2 becomes lower. The liquid refrigerant surface in the refrigerant container 2 can be increased by reducing the capacity of the header tank 9. Further, refrigerant in the refrigerant container 2 is need to be boiled, and heat from the heat-generating member 4 is need to be transmitted to refrigerant through the refrigerant container 2. Therefore, it is necessary to enlarge the capacity of the refrigerant container 2.

That is, in the fourth embodiment, by setting the capacity of the header tank 9 to be smaller than the capacity of the refrigerant container 2, sufficient cooling performance can be obtained in both the bottom posture and the side posture of the cooling unit 1.

A fifth embodiment of the present invention will be now described with reference to FIGS. 12–15. In the fifth embodiment, the heat radiation fins 10 described in the above first embodiment are eliminated from a cooling device 1. Generally, the heat radiation fins 10 are provided for increasing a heat radiation area on an air side and for improving the cooling performance of the cooling device 1. However, an amount of cooling air passing through the cooling device is reduced by an excessive pressure loss in the heat radiation fins 10. Especially in a cooler for a personal computer, a server and the like used in an office, a noise is strongly required to be reduced while an excessively large electric load is required for the cooling fan.

Figure 12:
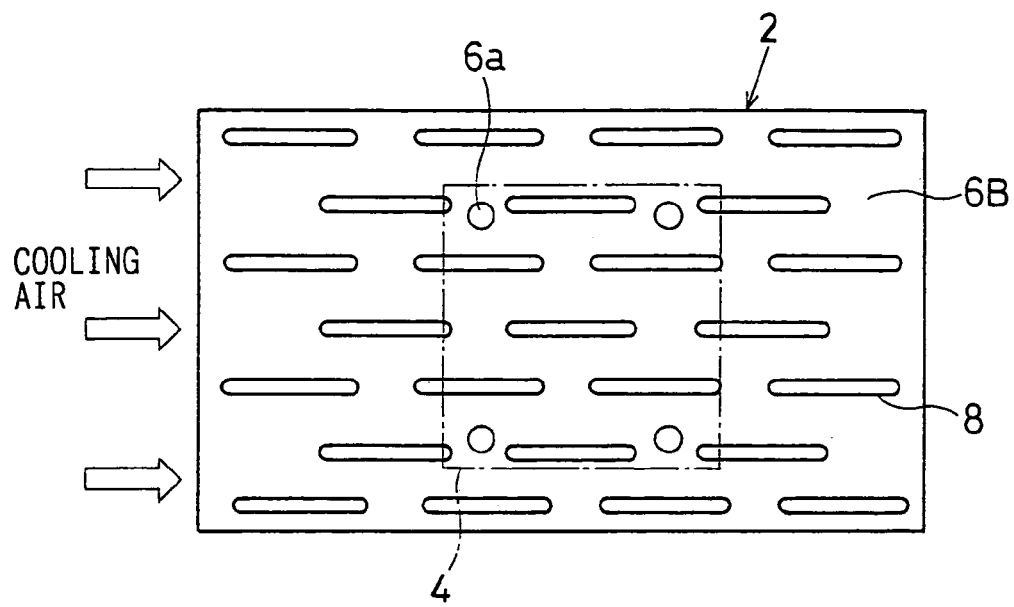
FIG. 12 is a plan view showing a heat radiation plate according to a fifth embodiment of the present invention.
Figure 13:
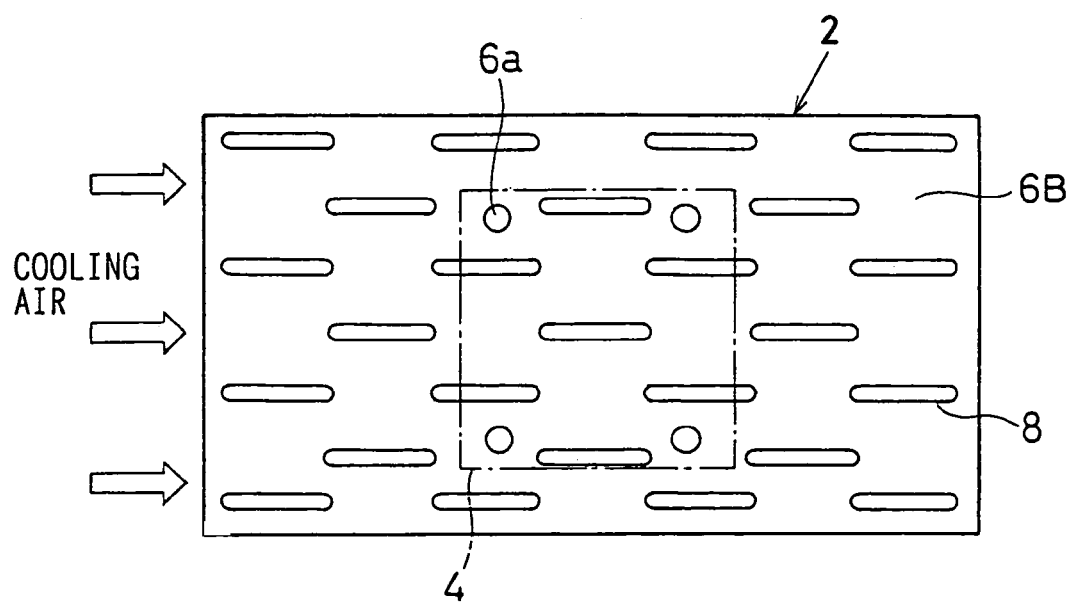
FIG. 13 is a plan view showing an another heat radiation plate according to the fifth embodiment.
Figure 14:
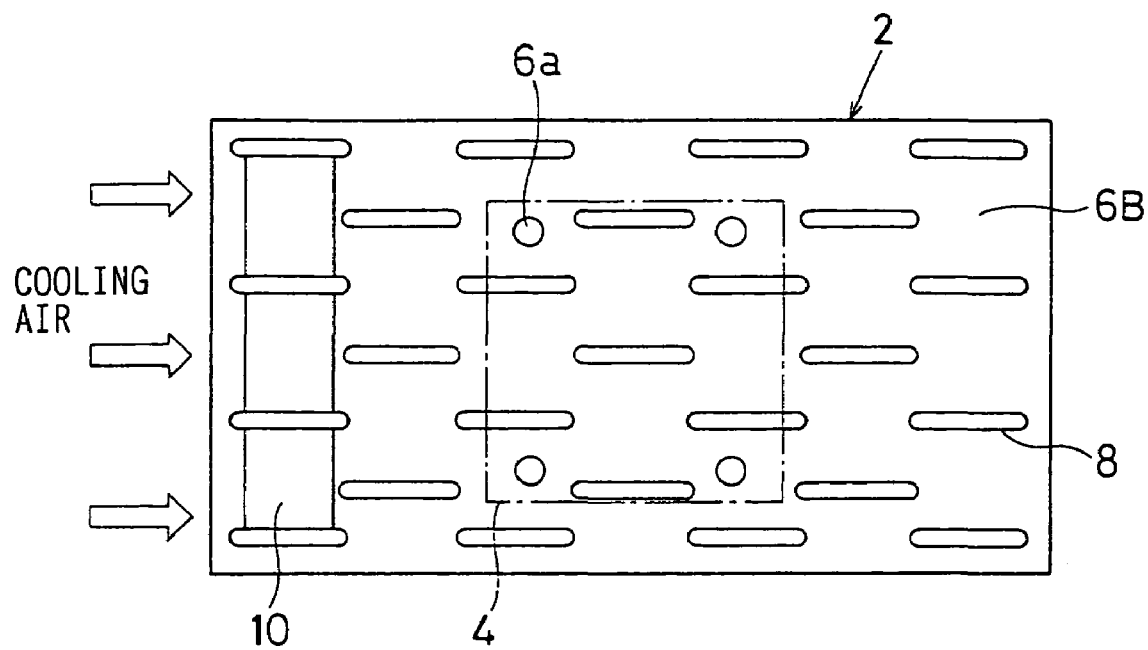
FIG. 14 is a plan view showing an another heat radiation plate according to the fifth embodiment.

In the fifth embodiment, the heat radiation fins 10 are eliminated, thereby solving problems such as increase of the number of fin attachment processes and deviation of fin set positions in fin attachment work. Further, the pressure loss at the air side can be greatly reduced, thereby improving the cooling performance of the cooling device 1 and reducing the noises thereof. Furthermore, since the heat radiation fins 10 are eliminated, the tubes 8 can be set at arbitrary positions, respectively. For example, as shown in FIG. 12, the tubes 8 can be disposed in zigzag so as to efficiently radiate heat. For example, as shown in FIG. 13, the tubes 8 can be disposed in zigzag so that the neighboring tubes 8 are not overlapped with each other in a direction perpendicular to the longitudinal direction of the heat radiation plate 6B, thereby improving attachment performance of the tubes 8. For example, as shown in FIG. 14, the heat radiation fins 10 can be partially provided between tubes 8 in a part of the tubes 8.

Figure 15:
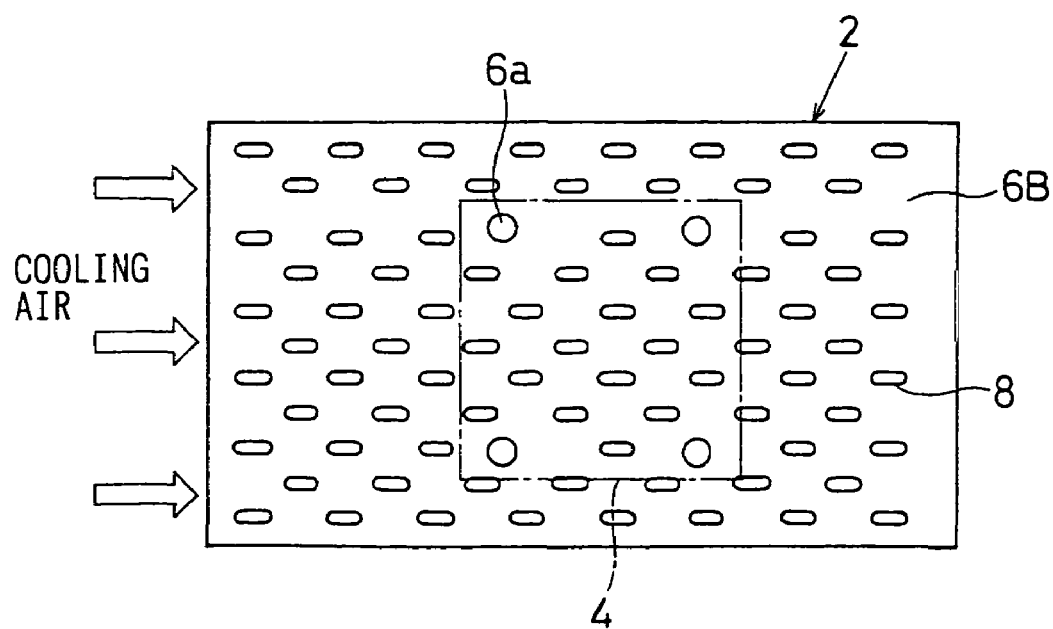
FIG. 15 is a plan view showing an another heat radiation plate according to the fifth embodiment.

When no heat radiation fin 10 is used, the number of the tubes 8 can be increased, thereby facilitating refrigerant circulation of the cooling device 1, and effectively improving heat radiation performance thereof. The tube 8 has a sectional shape with high heat-transmitting efficiency such as an oval shape. For example, as shown in FIG. 15, the tube 8 may be a hollow pin.

Figure 16:
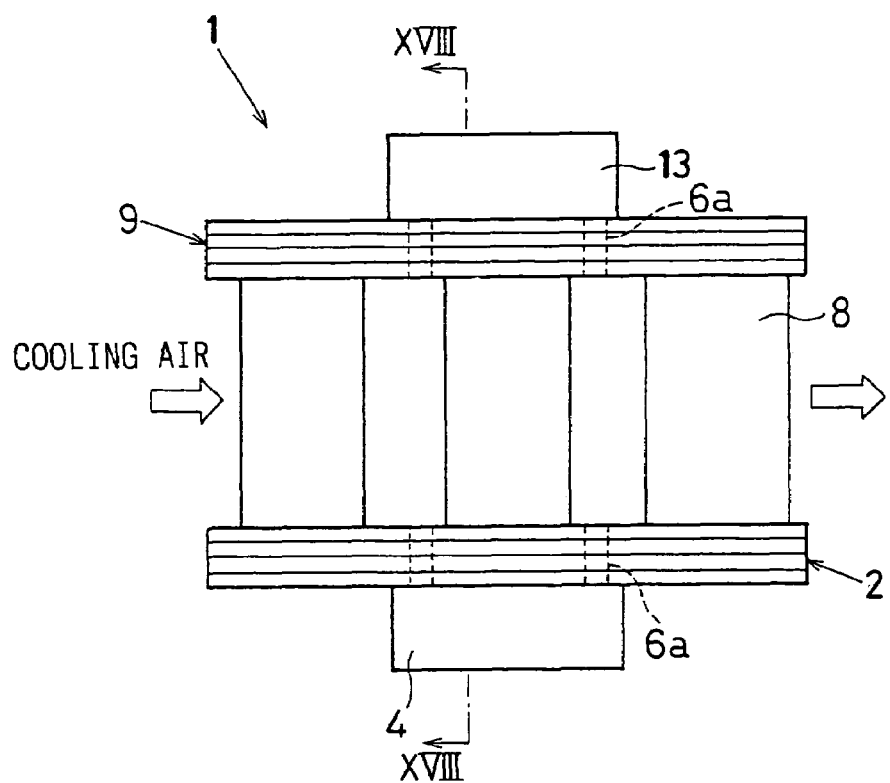
FIG. 16 is a schematic side view showing a cooling device according to a sixth embodiment of the present invention.

A sixth embodiment of the present invention will be now described with reference to FIGS. 16–18. In a cooling device 1 of the sixth embodiment, a first heat-generating member 4 is attached to the refrigerant container 2 and a second heat-generating member 13 is attached to the header tank 9, as shown in FIG. 16. Since the header tank 9 has the stack structure identical to the stack structure of the refrigerant container 2, the second heat-generating member 13 can be readily attached to the header tank 9 as in the refrigerant container 2. Thus, both the heat-generating members 4, 13 can be cooled by using the single cooling device 1 at the same time, thereby reducing total cost for this cooling system. However, when the second heat-generating member 13 is also attached to the header tank 9, gas refrigerant generated in the header tank 9 collides with gas refrigerant generated in the refrigerant container 2, so that refrigerant circulation may fail. Therefore, the refrigerant flow is need to be carefully controlled to prevent the refrigerant circulation failure.

Figure 17:
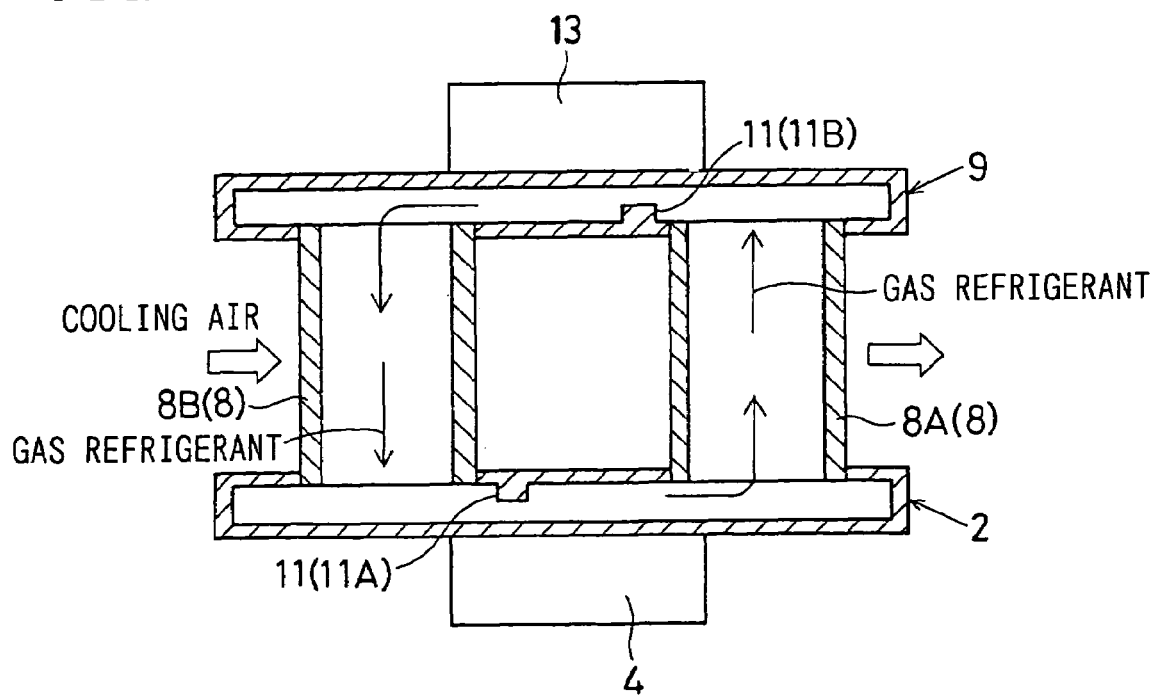
FIG. 17 is a schematic sectional view showing the cooling device according to the sixth embodiment.
Figure 18:
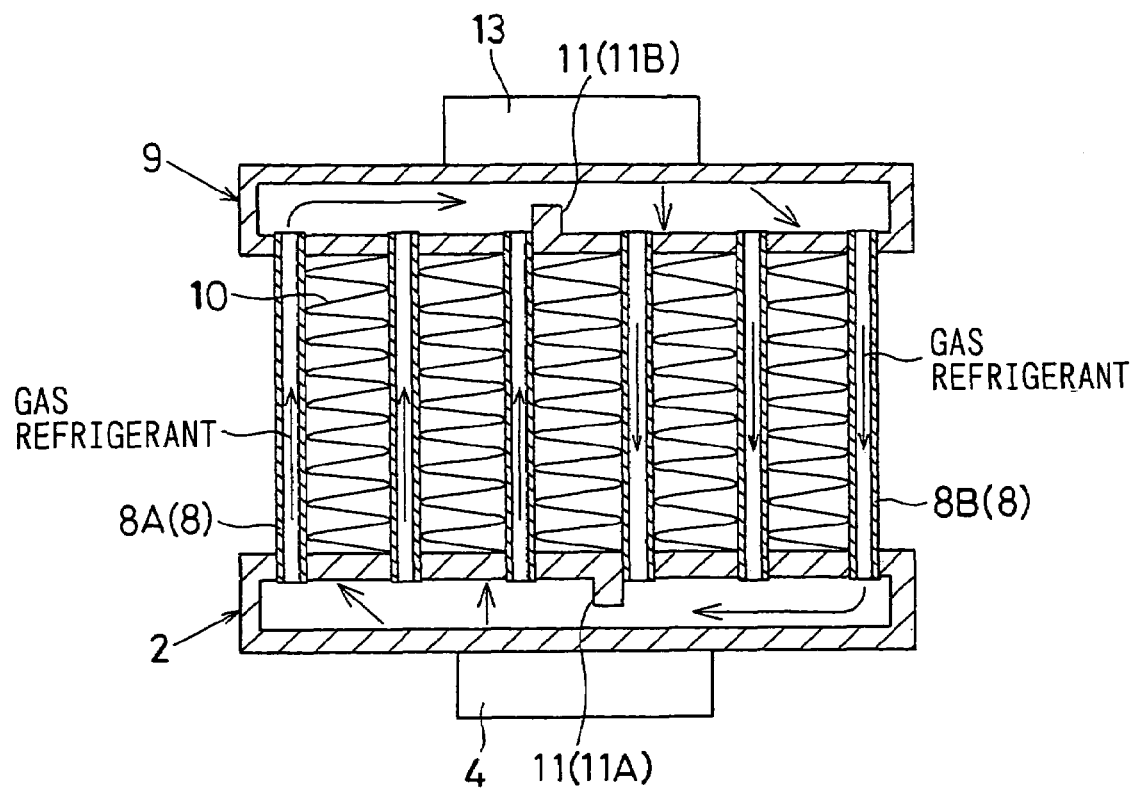
FIG. 18 is a schematic sectional view showing the cooling device taken along line XVIII—XVIII in FIG. 16.

In the sixth embodiment, as shown in FIGS. 17, 18, barrier portions 11 (11A, 11B) for controlling each refrigerant flow are provided in the refrigerant container 2 and the header tank 9, respectively, thereby facilitating the refrigerant circulation.

Specifically, as shown in FIG. 17, the barrier portion 11 (11A, 11B) are provide to divide first tubes 8A and second tubes 8B in the tubes 8. Gas refrigerant, boiled by receiving heat from the first heat-generating member 4 in the refrigerant container 2, flows toward the header tank 9 through the first tubes 8A. Gas refrigerant, boiled by receiving heat from the second heat-generating member 13 in the header tank 9, flows toward the refrigerant container 2 through the second tubes 8B. In the refrigerant container 2, the first barrier portions 11A are provided to restrict the gas refrigerant, boiled by receiving heat from the first heat-generating member 4, from flowing into the second tubes 8B. In the header tank 9, the second barrier portions 11B are provided to restrict the gas refrigerant, boiled by receiving heat from the second heat-generating member 13, from flowing into the first tubes 8A. Thus, as indicated by arrows in FIGS. 17, 18, the gas refrigerant boiled in the refrigerant container 2 does not collide with the gas refrigerant boiled in the header tank 9, and the gas refrigerant can satisfactorily circulate between the refrigerant container 2 and the header tank 9. Therefore, the first and second heat-generating members 4, 13 can be effectively cooled. Here, each of the first and second barrier portions 11A, 11B can be readily provided by stacking the metal portions of the intermediate plates 6C. That is, it is unnecessary to use additional members as the barrier portions 11 (11A, 11B).

Figure 19:
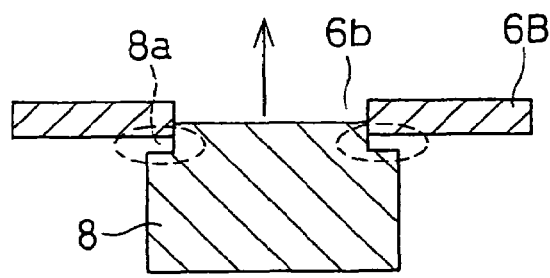
FIG. 19 is a schematic sectional view showing a stopper structure in a refrigerant container of a cooling device according to a seventh embodiment of the present invention.

A seventh embodiment of the present invention will be now described with reference to FIG. 19. In the seventh embodiment, attachment structures between the tubes 8 and the refrigerant container 2 and between the tubes 8 and the header tank 9 are described. Here, when the plural plates 6 are connected to each other by brazing, they are need to be accurately pressed to each other. In the seventh embodiment, as shown in FIG. 19, a notch 8a is provided in the tube 8 at an end inserted into the opening 6b of the heat radiation plate 6B. When a pressure is applied to the plates 6 through the notch 8a in each tube 8, the plates 6 can be accurately pressed to each other, thereby preventing brazing failure. Further, through the notch 8a, each tube can be accurately inserted into the refrigerant container 2 at a predetermined position. The same attachment structure can be used for that between the header tank 9 and the tubes 8. Even in this case, the same effect can be obtained.

Figure 20:
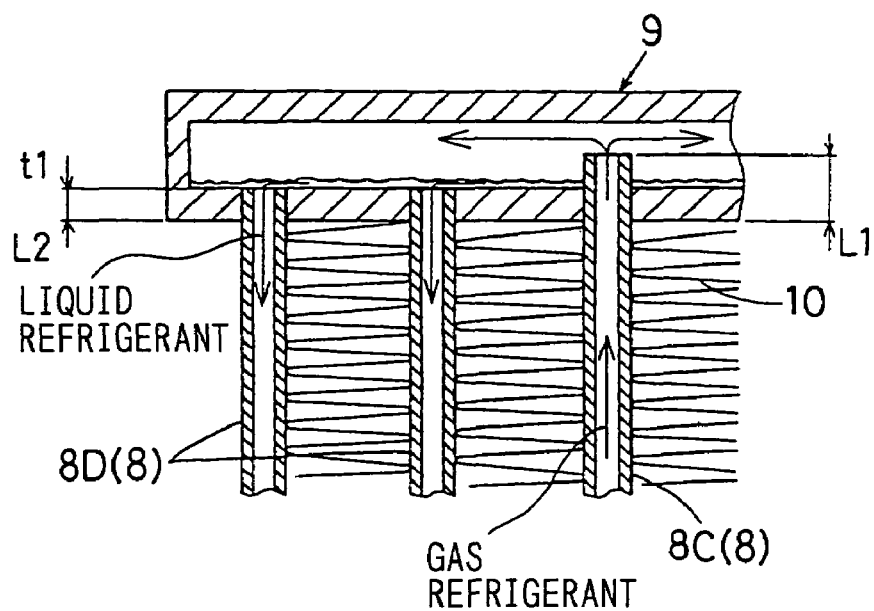
FIG. 20 is a schematic sectional view showing a part of a cooling device around an attachment portion between tubes and a header tank according to an eighth embodiment of the present invention.
Figure 21:
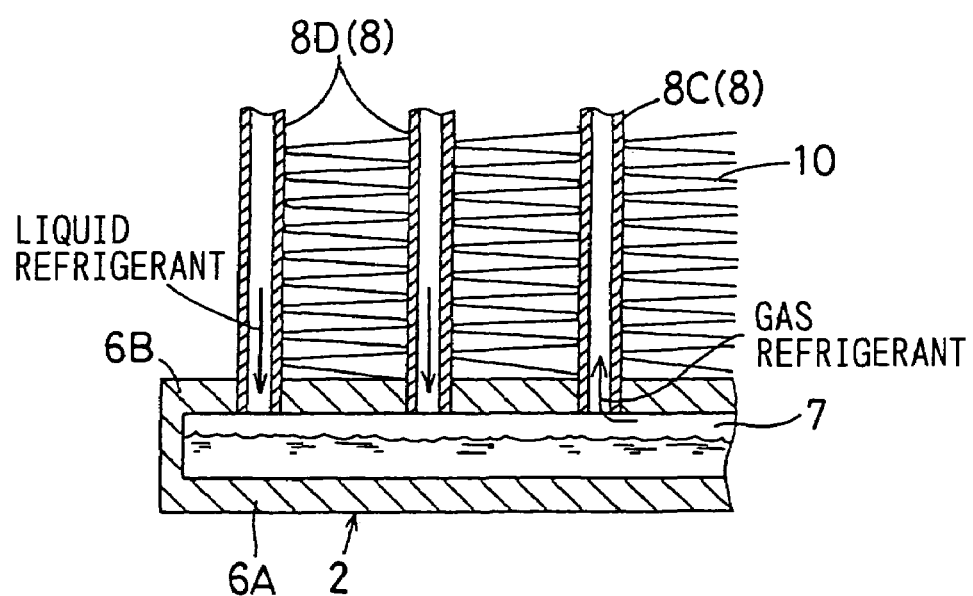
FIG. 21 is a schematic sectional view showing a part of the cooling device around an attachment portion of tubes and a refrigerant container according to the eighth embodiment.
Figure 22:
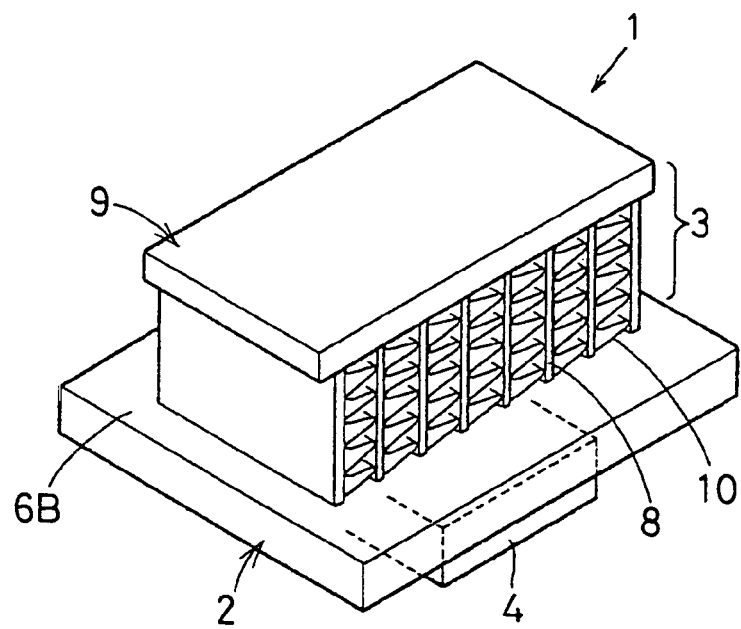
FIG. 22 is a perspective view showing the cooling device according to the eighth embodiment.

An eighth embodiment of the present invention will be now described with reference to FIGS. 20–22. In the eighth embodiment, an insertion length of a gas refrigerant tube (gas tube) 8C inserted into the header tank 9 is set different from that of a liquid refrigerant tube (liquid tube) 8D inserted into the header tank 9. As shown in FIG. 20, gas refrigerant flows into the header tank 9 from the refrigerant container 2 through the gas tube 8C. As shown in FIG. 21, liquid refrigerant flows into the refrigerant container 2 from the header tank 9 through the liquid tube 8D. Specifically, as shown in FIG. 20, an insertion length L1 of the gas tube 8C inserted into the header tank 9 is set larger than a plate thickness t1 of the header tank 9 at the bottom side. That is, an upper end of the gas tube 8C protrudes from an inner bottom surface of the header tank 9 inside the header tank 9 by a predetermined length. On the other hand, an insertion length L2 of the liquid tube 8D inserted into the header tank 9 is set substantially equal to the plate thickness t1. That is, an upper end of the liquid tube 8D does not protrude to the inside of the header tank 9 from the inner surface of the header tank 9.

Next, operation of the cooling device 1 according to the eighth embodiment will be now described. In the eighth embodiment, the cooling device 1 is used in the bottom posture where the refrigerant container 2 is disposed horizontally and the heat-generating member 4 is attached to the refrigerant container 2 on its bottom surface as shown in FIG. 22. The refrigerant stored in the refrigerant container 2 is boiled by receiving heat from the heat-generating member 4 in the refrigerant chamber 7. The boiled gas refrigerant flows mainly through the gas tubes 8C toward the header tank 9, while being cooled and condensed, and the condensed refrigerant (liquid refrigerant) is returned into the refrigerant chamber 7 through the liquid tubes 8D.

Since the gas tubes 8C protrude from the inner bottom surface of the header tank 9 to the inside thereof, the liquid refrigerant hardly flows into the gas tubes 8C from the header tank 9 when refrigerant is returned from the header tank 9 to the refrigerant container 2 through the tubes 8. Therefore, much of the liquid refrigerant is returned from the header tank 9 to the refrigerant container 2 through the liquid tubes 8D. As a result, as shown in FIG. 21, much of the gas refrigerant in the refrigerant container 2 flows into the gas tubes 8C. Therefore, a flow amount of the gas refrigerant flowing into the liquid tubes 8D in the refrigerant container 2 can be made smaller, thereby realizing a preferable refrigerant circulation in the cooling device 1. Even in the eighth embodiment, the refrigerant container 2 or the header tank 9 has the stack structure described in the above first embodiment.

In the eighth embodiment, the present invention also can be used for a cooling device where the refrigerant container 2 has a hollow structure or has an inner fin.

Figure 23:
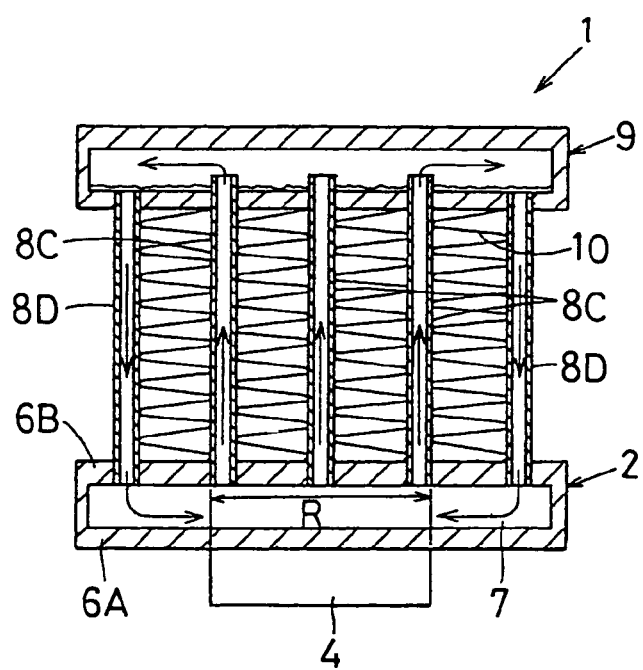
FIG. 23 is a schematic sectional view showing a cooling device according to a ninth embodiment of the present invention.

A ninth embodiment of the present invention will be now described with reference to FIG. 23. In the ninth embodiment, the gas tubes 8C are attached to the refrigerant container 2 in an attachment area R of the heat-generating member 4. The liquid tubes 8D are attached to the refrigerant container 2 outside the attachment area R. Specifically, as shown in FIG. 23, the heat-generating member 4 is attached to the heat reception plate 6A on an attachment area. Here, the attachment area R is an area corresponding to the attachment area of the heat-generating member 4 on the heat radiation plate 6B. Since the gas tubes 8C are disposed in the attachment area R where refrigerant is readily boiled in the refrigerant container 2, the gas refrigerant effectively flows into the gas tubes 8C from the refrigerant container. Further, the liquid tubes 8D are disposed outside the attachment area R, thereby reducing an amount of gas refrigerant flowing into the liquid tubes 8D from the refrigerant chamber 7. Therefore, the refrigerant circulation can be realized more effectively than the above-described eighth embodiment, and the heat radiation performance of the cooling device 1 can be further improved.

Figure 24:
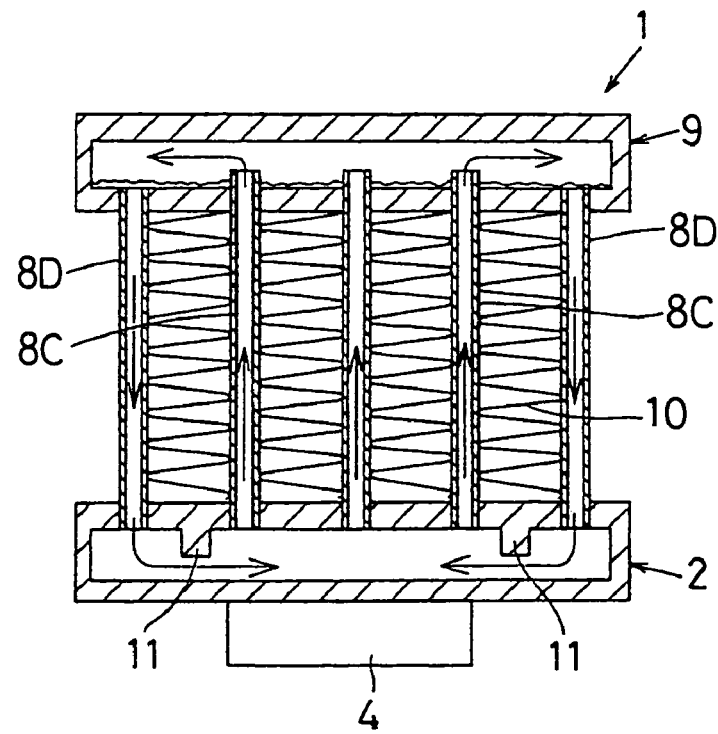
FIG. 24 is a schematic sectional view showing a cooling device according to a tenth embodiment of the present invention.

A tenth embodiment of the present invention will be now described with reference to FIG. 24. In the tenth embodiment, the barrier portions 11 for controlling gas refrigerant flow, described in the second embodiment, are provided in the refrigerant container 2 of a cooling device 1 according to the ninth embodiment. As shown in FIG. 24, the barrier portions 11 are provided between the gas tubes 8C and the liquid tubes 8D. The barrier portions 11 control the gas refrigerant, boiled by receiving the heat from the heat-generating member 4, to not flow into the liquid tubes 9B, thereby realizing the further preferable refrigerant circulation. In the tenth embodiment, the barrier portions 11 can be readily formed by changing the shapes of the intermediate plates 6C.

Figure 25:
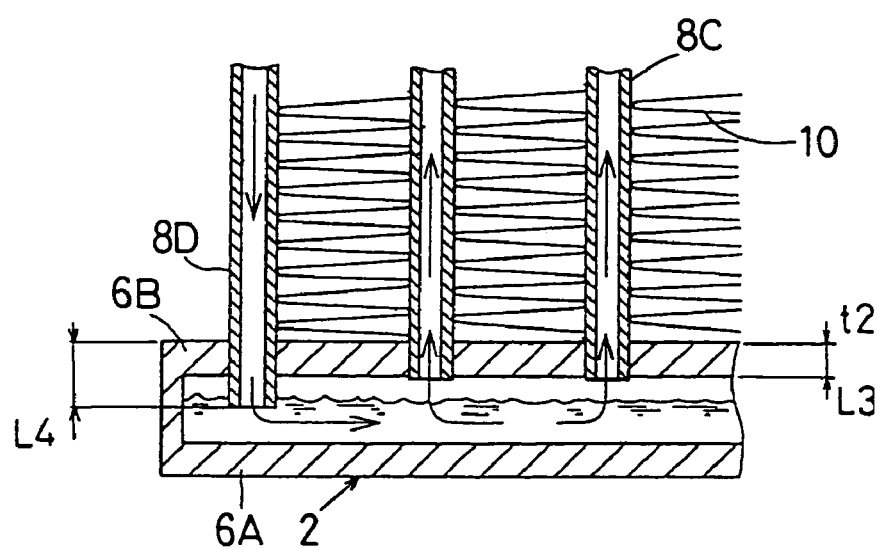
FIG. 25 is a schematic sectional view showing a part of a cooling device around an attachment portion of tubes and a refrigerant container, according to an eleventh embodiment of the present invention.

An eleventh embodiment of the present invention will be now described with reference to FIG. 25. In the eleventh embodiment, an insertion length of the gas tube 8C inserted into the refrigerant container 2 is set different from an insertion length of the liquid tube 8D inserted into the refrigerant container 2. Specifically, as shown in FIG. 25, an insertion length L3 of the gas tube 8C into the refrigerant container 2 is set substantially equal to a plate thickness t2 of the heat radiation plate 6B. That is, a lower end of the gas tube 8C does not protrude from the inner surface of the refrigerant container 2 to an inside thereof. The insertion length L4 of the liquid tube 8D is set larger than the plate thickness t2. That is, a lower end of the liquid tube 8D protrudes from the inner surface of the refrigerant container 2 to the inside thereof. Accordingly, when the gas refrigerant, boiled in the refrigerant container 2, flows into the tubes 8, the gas refrigerant does not flows into the liquid tubes 8D but flows into the gas tubes 8C. Therefore, the liquid refrigerant is readily returned from the header tank 9 into the refrigerant container 2 through the liquid tubes 8D, and the gas refrigerant flowing through the liquid tubes 8D can be restricted, thereby realizing the preferable refrigerant circulation.

Figure 26:
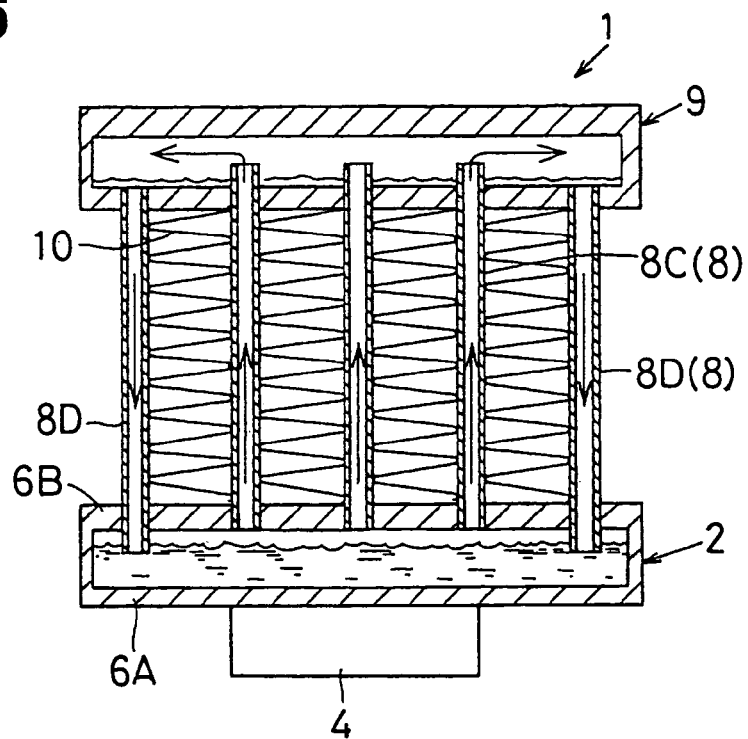
FIG. 26 is a schematic sectional view showing a cooling device according to a twelfth embodiment of the present invention.

A twelfth embodiment of the present invention will be described with reference to FIG. 26. In the twelfth embodiment, both the feature of the cooling device of the eleventh embodiment and the feature of the cooling device in the eighth embodiment are added. Specifically, as shown in FIG. 26, the insertion length of the gas tube 8C inserted into the header tank 9 is set larger than the plate thickness of the bottom wall of the header tank 9, and the insertion length of the gas tube 8C inserted into the refrigerant container 2 is set equal to the plate thickness of the heat radiation plate 6B. In addition, the insertion length of the liquid tube 8D inserted into the header tank 9 is set equal to the plate thickness of the header tank 9 at the bottom side, and the insertion length of the liquid tube 8D inserted into the refrigerant container 2 is set larger than the plate thickness of the heat radiation plate 6B of the refrigerant container 2. The gas tubes 8C are disposed in the attachment area R shown in FIG. 24, and the liquid tubes 8D are disposed outside the attachment area R.

Accordingly, much of the gas refrigerant, boiled in the refrigerant container 2, flows into the gas tubes 8C, and much of the liquid refrigerant in the header tank 9 flows into the liquid tubes 8D, thereby effectively forming a refrigerant-circulation cycle, and realizing the cooling device 1 having high heat radiation performance. Further, an entire length of the gas tube 8C can be set equal to an entire length of the liquid tube 8D in FIG. 26. In this case, the management of components of the cooling device 1 can be simplified, and troubles such as assembling errors can be eliminated.

Figure 27A:
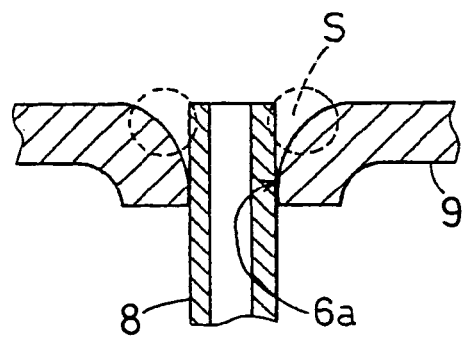
FIG. 27A is a schematic sectional view showing an insertion structure of a tube into a header tank of a cooling device according to a thirteenth embodiment of the present invention.
Figure 27B:
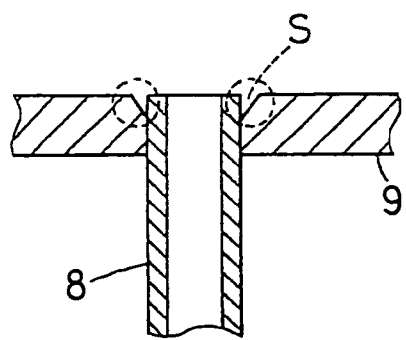
FIG. 27B is a schematic sectional view showing another insertion structure of the tube into the header tank according to the thirteenth embodiment.
Figure 28:
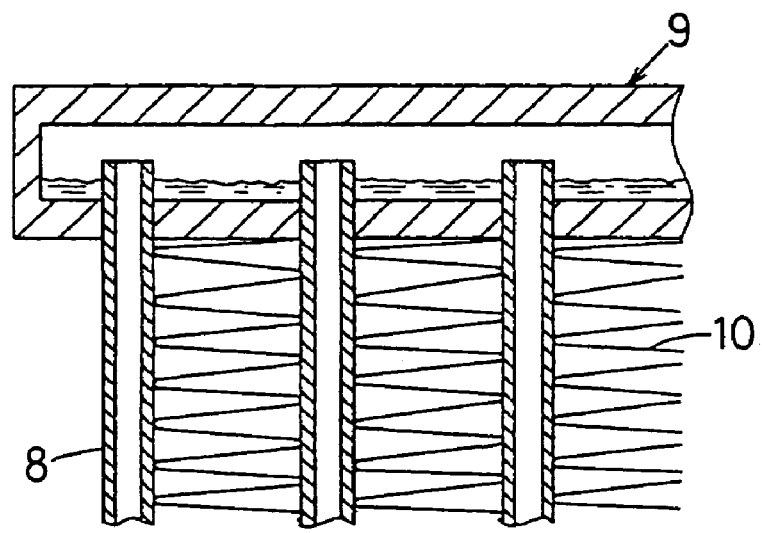
FIG. 28 is a schematic sectional view showing a part of a reference cooling device around an attachment portion of tubes and a header tank, for explaining the thirteenth embodiment.
Figure 29:
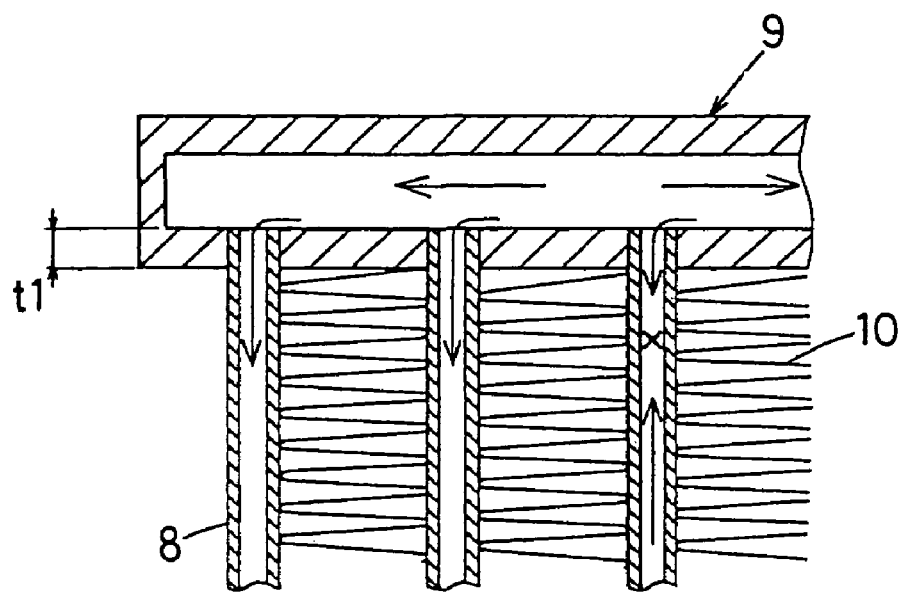
FIG. 29 is a schematic sectional view showing a part of an another reference cooling device for explaining the thirteenth embodiment.

A thirteenth embodiment of the present invention will be now described with reference to FIGS. 27A–27B, and 28–29. In the thirteenth embodiment, a joint structure between the header tank 9 and each tube 8 is formed as shown in FIGS. 27A, 27B. It is preferable that each tube 8 is attached to the header tank 9 while each upper end of the tubes 8 protrudes into the header tank 9 as shown in FIG. 28, for improving the brazing performance between the tubes 8 and the header tank 9 and for preventing an introduction of a brazing material into the tubes 8. However, in the attachment structure shown in FIG. 28, liquid refrigerant is stored in the header tank 9, thereby reducing an amount of the liquid refrigerant returned into the refrigerant container 2 from the header tank 9, and reducing the heat radiation performance of the cooling device 1. In order to prevent the liquid refrigerant from being stored in the header tank 9, it is preferable that each of the tubes 8 does not protrude into the header tank 9, as shown in FIG. 29.

According to the thirteenth embodiment of the present invention, the tubes 8 are attached to the header tank 9, so that it can prevent the liquid refrigerant from being stored in the header tank 9 while preventing the brazing material from flowing into the tubes 8.

Specifically, as shown in FIG. 27A, insertion holes 6a for the tubes 8 are provided by burring in the header tank 9. More specifically, the header tank 9 protrudes outside around each insertion hole 6a so that a space S is provided between the inserted tube 8 and the header tank 9. Here, the top end is set at a position approximately equal to the inner surface of the header tank 9. Since the brazing material is stored in the space S provided around the tube 8 inserted to each insertion hole 6a, it can be effectively prevented the brazing material from flowing into the tube 8. Further, as shown in FIG. 27B, the insertion holes 6a can be formed by pressing in the header tank 9. In this case, a chamfer is provided around each insertion hole 6a, thereby forming the space S on inner side of the header tank 9. The chamfers may be provided by cutting. Even in this case, the same effect as that in FIG. 27 can be obtained.

Figure 30:
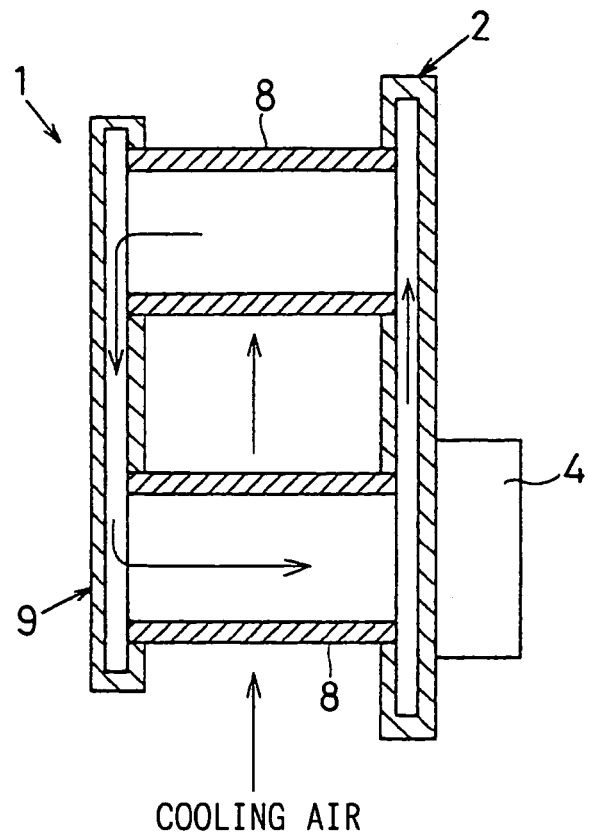
FIG. 30 is a schematic sectional view showing a cooling device, used in a side posture, according to a fourteenth embodiment of the present invention.

A fourteenth embodiment of the present invention will be now described with reference to FIGS. 30–32. In the fourteenth embodiment, the tubes 8 are arranged relative to the refrigerant container 2 and the header tank 9 while being divided to upstream side tubes and downstream side tubes in a flow direction of cooling air. As shown in FIG. 30, even when the cooling device 1 is used in the side posture, refrigerant circulates as indicated by arrows, thereby improving the heat radiation performance of the cooling device 1.

Figure 31:
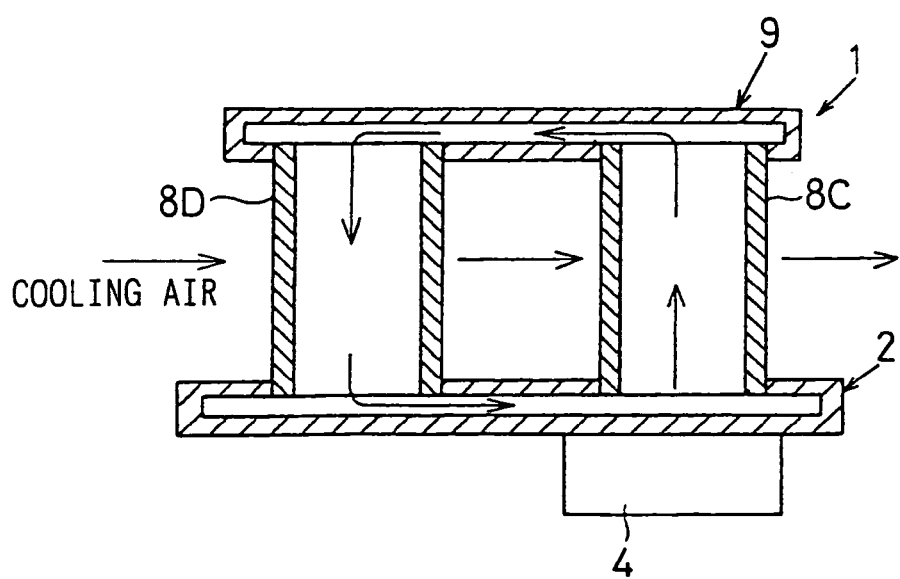
FIG. 31 is a schematic sectional view showing a cooling device, used in a bottom posture, according to the fourteenth embodiment.
Figure 32:
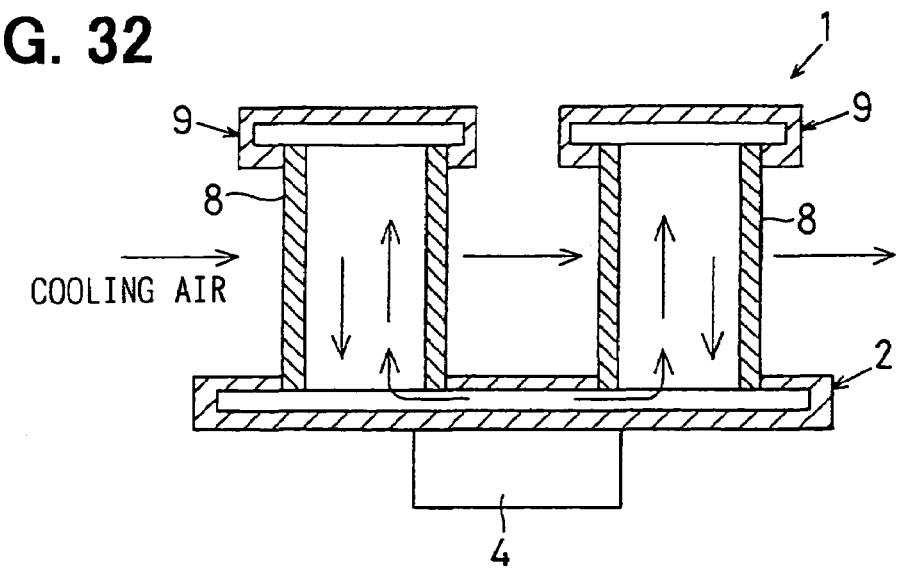
FIG. 32 is a schematic sectional view showing a cooling device having two header tanks divided from each other, according the fourteenth embodiment.

As shown in FIG. 31, when the cooling device 1 is used in the bottom posture, the heat radiation performance can be improved. In this case, preferably, the liquid tubes 8D are disposed at the upstream side of cooling air, and the gas tubes 8C are disposed at the downstream side thereof, thereby further facilitating the refrigerant circulation. Since the gas tubes 8C are disposed at the downstream side of cooling air, the gas tubes 8C can be maintained at a temperature higher than the liquid tubes 8D. Therefore, gas refrigerant flowing in the gas tubes 8C can be prevented from being condensed therein, thereby maintaining the refrigerant circulation. Further, as shown in FIG. 32, the header tank 9 may be divided to two portions. That is, the heat radiation core 3 can be divided into plural parts in the flow direction of cooling air.

Figure 33A:
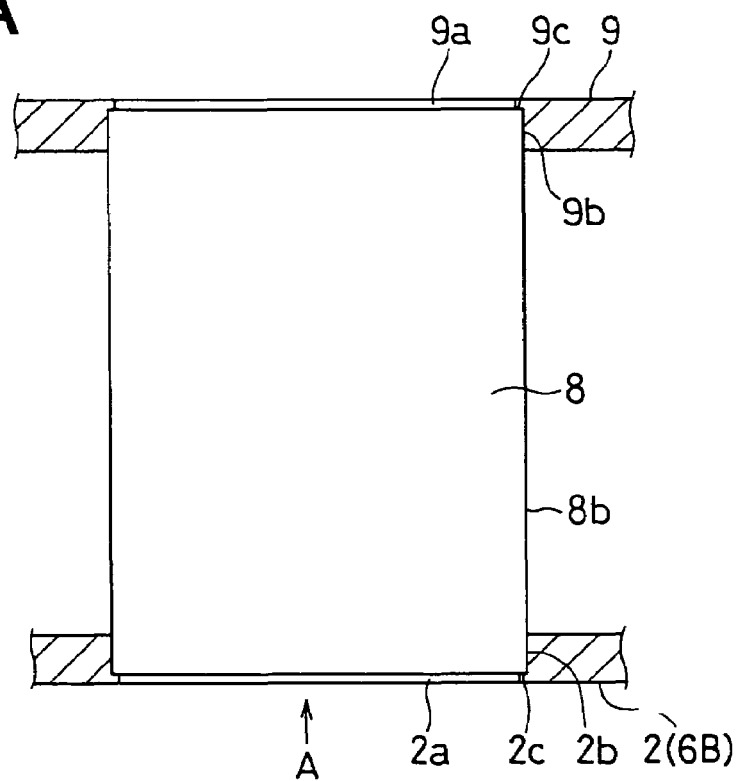
FIG. 33A is a schematic diagram showing an insertion state of a tube into a refrigerant container and a header tank in a fifteenth embodiment of the present invention.
Figure 33B:
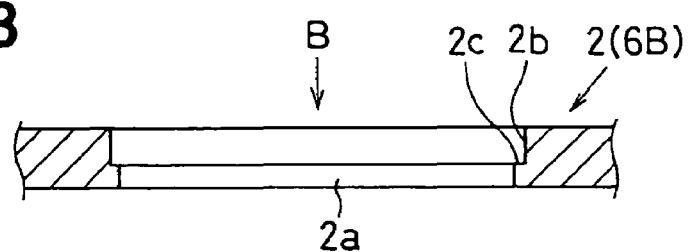
FIG. 33B is a schematic sectional view showing a part of the refrigerant container according to the fifteenth embodiment.
Figure 34:
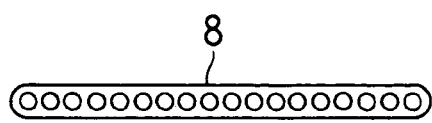
FIG. 34 is a plan view showing an end surface of a tube according to the fifteenth embodiment.
Figure 35:
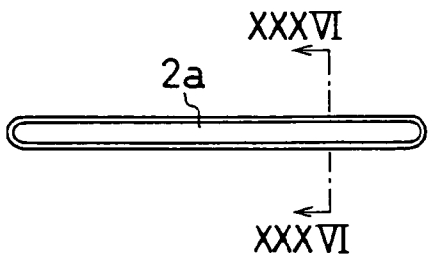
FIG. 35 is a side view showing a part of the refrigerant container when being viewed from an arrow B in FIG. 33B.

A fifteenth embodiment of the present invention will be now described with reference to FIGS. 33A, 33B and 34–37. In the fifteenth embodiment, as shown in FIGS. 33A and 33B, the insertion lengths of the tubes 8 inserted into the refrigerant container 2 and the header tank 9 are regulated by insertion holes 2a, 9a provided in the refrigerant container 2 (heat radiation plate 6B) and the header tank 9, respectively. Specifically, each of the insertion holes 2a, 9a is provided in a step shape, and each tube 8 is attached to the refrigerant container 2 and the header tank 9 through the insertion holes 2a. 9a. Each tube 8 have plural through holes 34a (e.g., circular through holes or rectangular through hoes) extending in the tube longitudinal direction, and both ends of the tube 8 are formed in the shape shown in FIG. 34. As shown in FIGS. 33A, 33B, 34–36, a side surface 8b of the tube 8 is fitted to an inner surface 2b of the insertion hole 2a, and the top end of the tube 8 contacts a step surface 2c of the insertion hole 2a. Thus, the insertion length of the tube 2 inserted into the refrigerant container 2 is restricted. The insertion length of the tube 8 inserted into the header tank 9 is also restricted in the same manner.

Figure 36:
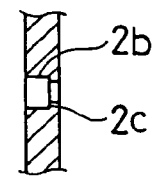
FIG. 36 is a sectional view showing a part of the refrigerant container taken along line XXXVI—XXXVI in FIG. 35.
Figure 37:
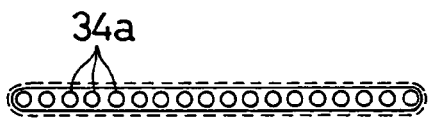
FIG. 37 is a schematic diagram showing a tube insertion state when being viewed from arrow A in FIG. 33A.

Accordingly, the insertion lengths of the tube 8 inserted into the refrigerant container 2 and the header tank 9 can be controlled using the insertion holes 2a, 9a provided in the refrigerant tank 2 and the header tank 9 while no notch 8a shown in FIG. 19 is provided in the tube 8 at an end inserted into the insertion holes 2a, 9a. Since the insertion length can be regulated, the dimensions of the refrigerant container 2 and the header tank 9 can be reduced in the insertion direction of the tube 8 without closing the through holes 34a of each tube 8 as shown in FIG. 37. In this embodiment, a dimension of each flat tube 8 in the tube thickness direction (up-down direction in FIG. 37) is set approximately equal to a dimension of each insertion hole 2a, 9a in the same direction as the up-down direction in FIG. 37. For example, each of the dimension of the flat tube 8 and the dimension of the hole 2a in the up-down direction of FIG. 37 is approximately 1.7 mm. Further, the dimension between the step surface in the up-down direction in FIG. 36 is set at 1.5 mm, for example, and each diameter of the through holes 34a is set at 1.1 mm, for example. Accordingly, even when the tube 8 is inserted into the insertion hole 2a, 9a, any through hole 34a is not closed by the step surface 2c, 9c while the tube insertion length can be accurately controlled. Therefore, the capacity (height) of each tube 8 can be enlarged, thereby improving the cooling performance (heat radiation performance). That is, as shown in FIG. 33A, since the step surfaces 2c, 9c of the insertion holes 2a, 9a are provided so as not to close a through hole 34a of the tube 8, respectively. Furthermore, the cooling device 1 can be temporarily assembled only by inserting the ends of the tubes 8 into the insertion holes 2a, 9a of the refrigerant container 2 and the header tank 9 without a complex (expensive) jig. Therefore, the cooling device 1 temporarily assembled can be readily integrally brazed, without using complex (expensive) brazing jig.

In the above-described fifteenth embodiment, the insertion hole 2a, 9a may be provided in the plate 6B or may be provided in the intermediate plate 6C. Alternatively, a step portion for regulating an insertion length of each tube 8 can be provided in the tubes 8 similarly to the above-described seventh embodiment (FIG. 19), while the refrigerant passage in each tube 8 is not closed. Even in this case, the insertion length of the tubes 8 inserted into the refrigerant container 2 or inserted into the header tank 9 can be suitably regulated.

Although the present invention has been fully described in connection with the preferred embodiments thereof with reference to the accompanying drawings, it is to be noted that various changes and modifications will become apparent to those skilled in the art.

Figure 38:
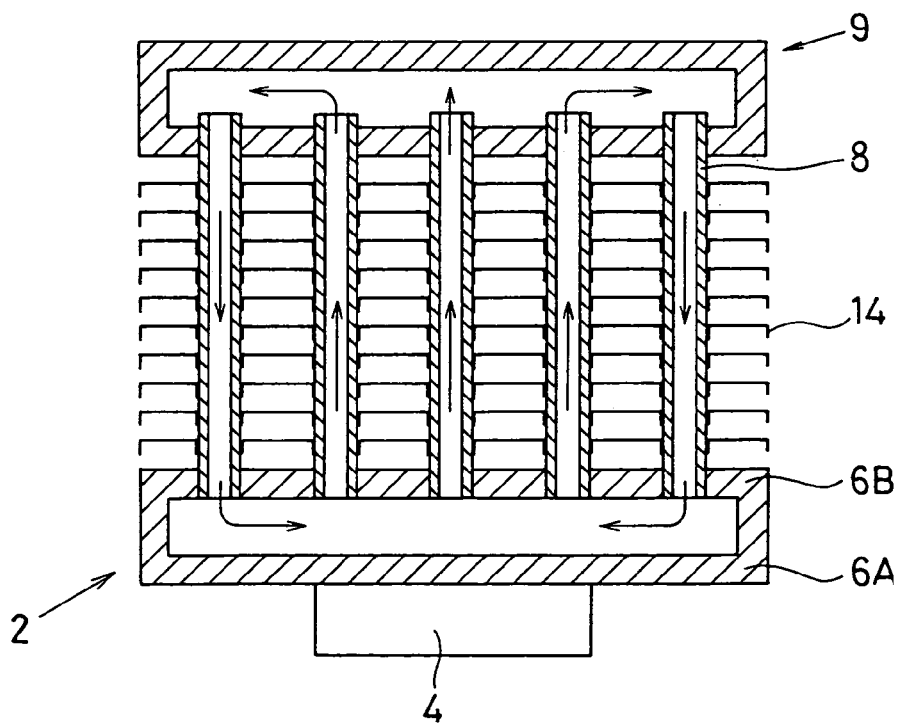
FIG. 38 is a schematic sectional view showing a cooling device according to a modification of the present invention.
Figure 39:
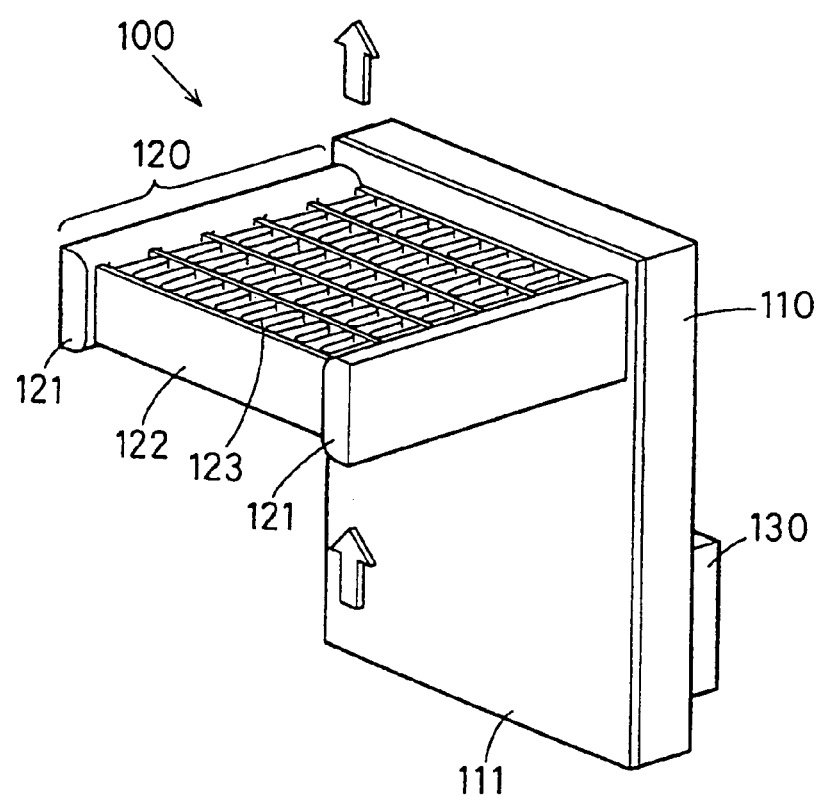
FIG. 39 is a perspective view showing a conventional cooling device.

For example, in the above-described embodiments, as shown in FIG. 38, plate fins 14 may be used as the heat radiation fins 10 described in the above embodiments.

Further, the plural embodiments described above may be suitably used by combination.

Such changes and modifications are to be understood as being within the scope of the present invention as defined by the appended claims.

What is claimed is:

1. A cooling device for cooling a heat-generating member, comprising:
   a refrigerant container constructed by stacking a plurality of plates for defining a space where refrigerant is stored, the plurality of plates including a first plate to which the heat-generating member is attached, a second plate disposed opposite to the first plate and at least a third plate between the first plate and the second plates; and
   a heat radiation core including;
      a plurality of tubes attached to the second plate of the refrigerant container substantially vertically to a surface of the second plate, to communicate with the space of the refrigerant container; and
      a header tank constructed by stacking a plurality of plates, through which the tubes communicate with each other; wherein:
   the refrigerant container and heat radiation core are disposed in such a manner that, refrigerant is boiled by receiving heat from the heat-generating member attached to the first plate of the refrigerant container, and the boiled refrigerant flows into the tubes to radiate heat to outside in the heat radiation core;
   the plurality of tubes includes first tubes each having an insertion length inserted into the header tank, and second tubes each having an insertion length inserted into the header tank, smaller than that of each first tube; and
   each first tube protrudes from an inner surface of the header tank inside the header tank by a predetermined length.

2. The cooling device according to claim 1, wherein:
   the plurality of tubes is divided into a first tube group through which refrigerant mainly flows from the refrigerant container into the header tank, and a second tube group through which refrigerant mainly flows from the header tank into the refrigerant container;
   the refrigerant container has therein a first barrier portion for restricting refrigerant from flowing into the second tube group; and
   the header tank has therein a second barrier portion for restricting refrigerant from flowing into the first tube group.

3. The cooling device according to claim 1, wherein the header tank has a capacity smaller than a capacity of the refrigerant container.

4. The cooling device according to claim 1, wherein each plate constructing the refrigerant container has a surface area larger than that of each plate constructing the header tank.

5. The cooling device according to claim 1, wherein at least one of the plates constructing the refrigerant container has the same shape as at least one of the plates constructing the header tank.

6. The cooling device according to claim 1, wherein another heat-generating member is attached to the plate disposed at a most outside of the header tank.

7. The cooling device according to claim 6, wherein:
the plurality of tubes is divided into a first tube group through which gas refrigerant boiled in the refrigerant container flows from the refrigerant container to the header tank and a second tube group through which gas refrigerant boiled in the header tank flows from the header tank to the refrigerant container;
the refrigerant container has therein a first barrier portion for restricting gas refrigerant from flowing into the second tube group; and
the header tank has therein a second barrier portion for restricting gas refrigerant from flowing into the first tube group.

8. The cooling device according to claim 1, wherein the tubes are disposed on the second plate of the refrigerant container in zigzag.

9. The cooling device according to claim 1, wherein:
each second tube has an insertion length inserted into the refrigerant container, larger than that of each first tube inserted into the refrigerant container; and
each second tube protrudes from an inner surface of the refrigerant container inside the refrigerant container by a predetermined length.

10. The cooling device according to claim 1, wherein:
the heat-generating member is attached onto the first plate in an attachment area; and
the first tubes are disposed on the second plate within an area corresponding to the attachment area, and the second tubes are disposed on the second plate of the refrigerant container outside the area corresponding to the attachment area.

11. The cooling device according to claim 1, wherein the insertion length of each second tube inserted into the header tank is set to be substantially equal to a plate thickness of the plate of the header tank, into which each second tube is inserted.

12. The cooling device according to claim 9, wherein the insertion length of each first tube inserted into the refrigerant container is set to be substantially equal to a plate thickness of the second plate of the refrigerant container.

13. The cooling device according to claim 1, wherein one of each tube and the header tank includes a first insertion regulating member for regulating the insertion length of the tube inserted into the header tank.

14. The cooling device according to claim 13, wherein:
the first insertion regulating member is a step portion provided at an end of the tube;
the step portion has a surface substantially perpendicular to an insertion direction of the tube; and
the surface of the step portion contacts the header tank when the tube is connected to the header tank.

15. The cooling device according to claim 13, wherein:
the first insertion regulating member is a step portion provided in the header tank around an insertion hole of the header tank, into which the tube is inserted to communicate with the header tank;
the step portion has a surface substantially perpendicular to the insertion direction of the tube; and
a top end of the tube contacts the surface of the step portion when the tube is inserted into the insertion hole.

16. The cooling device according to claim 1, wherein:
the header tank includes:
a first plate defining a plurality of first holes into which the tubes are inserted; and
a second plate with which the first plate is stacked, the second plate defining a plurality of second holes each having an open area smaller than an open area of each first hole; and
the tube is inserted into the first hole to contact the second plate around the second hole to communicate with the second hole.

17. The cooling device according to claim 1, wherein one of each tube and the refrigerant container includes a second insertion regulating member for regulating the insertion length of the tube inserted into the refrigerant container.

18. The cooling device according to claim 17, wherein:
the second insertion regulating member is a step portion provided at an end of the tube;
the step portion has a surface substantially perpendicular to an insertion direction of the tube; and
the surface of the step portion contacts the second plate of the refrigerant container when the tube is connected to the header tank.

19. The cooling device according to claim 17, wherein:
the second insertion regulating member is a step portion provided in the second plate of the refrigerant container around an insertion hole into which the tube is inserted to communicate with the refrigerant container;
the step portion has a surface substantially perpendicular to the insertion direction of the tube; and
a top end of the tube contacts the surface of the step portion when the tube is inserted into the insertion hole.

20. The cooling device according to claim 1, wherein:
the second plate of the refrigerant container defines a first hole into which the tube is inserted;
one of the third plate stacked on the second plate defines a second hole having an open area smaller than an open area of the first hole of the second plate; and
the tube is inserted into the first hole of the second tube to contact the one of the third plates around the second hole to communicate with the second hole of the one of the third plates.

21. The cooling device according to claim 1, wherein:
the heat radiation core is disposed to perform heat exchange between the refrigerant flowing through the tubes and air passing through the heat radiation core outside the tubes; and
the heat radiation core is disposed to be divided into at least two core parts in a flow direction of air passing through the heat radiation core.

22. A cooling device for cooling a heat-generating member, comprising:
a refrigerant container constructed by stacking a plurality of plates for defining a space where refrigerant is stored, the plurality of plates including a first plate to which the heat-generating member is attached, a second plate disposed opposite to the first plate and at least a third plate between the first plate and the second plates; and
a heat radiation core including;
a plurality of tubes attached to the second plate of the refrigerant container substantially vertically to a surface of the second plate, to communicate with the space of the refrigerant container; and
a header tank constructed by stacking a plurality of plates, through which the tubes communicate with each other; wherein:

the refrigerant container and heat radiation core are disposed in such a manner that, refrigerant is boiled by receiving heat from the heat-generating member attached to the first plate of the refrigerant container, and the boiled refrigerant flows into the tubes to radiate heat to outside in the heat radiation core;

the plurality of tubes includes first tubes each having an insertion length inserted into the refrigerant container, and second tubes each having an insertion length inserted into the refrigerant container, larger than that of each first tube; and each second tube protrudes from an inner surface of the refrigerant container inside the refrigerant container by a predetermined length.

* * * * *